(12) United States Patent
Dair

(10) Patent No.: US 10,154,344 B2
(45) Date of Patent: Dec. 11, 2018

(54) SURROUND SOUND APPLICATIONS AND DEVICES FOR VERTICALLY-ORIENTED CONTENT

(71) Applicant: Thomas Mitchell Dair, Lafayette, CA (US)

(72) Inventor: Thomas Mitchell Dair, Lafayette, CA (US)

(*) Notice: Subject to any disclaimer, the term of this patent is extended or adjusted under 35 U.S.C. 154(b) by 0 days.

(21) Appl. No.: 15/360,798

(22) Filed: Nov. 23, 2016

(65) Prior Publication Data
US 2017/0150263 A1 May 25, 2017

Related U.S. Application Data

(60) Provisional application No. 62/259,972, filed on Nov. 25, 2015.

(51) Int. Cl.
| | | |
|---|---|---|
| *H04R 5/02* | (2006.01) | |
| *H04S 3/00* | (2006.01) | |
| *G06F 3/16* | (2006.01) | |
| *H03G 3/20* | (2006.01) | |
| *H04R 1/02* | (2006.01) | |

(52) U.S. Cl.
CPC ............... *H04R 5/02* (2013.01); *H04S 3/008* (2013.01); *G06F 3/165* (2013.01); *H03G 3/20* (2013.01); *H04R 1/028* (2013.01); *H04R 2420/01* (2013.01); *H04R 2420/03* (2013.01); *H04S 2400/01* (2013.01)

(58) Field of Classification Search
CPC ...... H04R 1/028; H04R 5/02; H04R 2420/01; H04R 2420/03; H04S 3/008; H04S 2400/01; G06F 3/165; H03G 3/20
See application file for complete search history.

(56) References Cited

U.S. PATENT DOCUMENTS

| | | | |
|---|---|---|---|
| 4,998,283 A * | 3/1991 | Nishida ................ | G03B 21/565 181/161 |
| 5,717,765 A | 2/1998 | Ozaki et al. | |
| 6,477,256 B1 * | 11/2002 | Stoehr .................... | H04N 5/642 348/E5.13 |
| 6,624,873 B1 | 9/2003 | Callahan, Jr. et al. | |

(Continued)

FOREIGN PATENT DOCUMENTS

JP 2007134939 A * 5/2007

OTHER PUBLICATIONS

International Search Report and Written Opinion Received for PCT Appl. PCT/US2016/063644 dated Jan. 31, 2017.

*Primary Examiner* — Davetta W Goins
*Assistant Examiner* — Kuassi Ganmavo
(74) *Attorney, Agent, or Firm* — Dorsey & Whitney LLP

(57) ABSTRACT

Examples described herein include surround sound systems for vertically-oriented displays and televisions that may leverage existing audio formats, recording techniques and audio authoring tools specifically for vertical display applications. Audio speakers and the vertically-oriented display may all be arranged on a single vertical plane to deliver visual image and spatial audio sound and sound effects on the vertical (e.g. top and bottom) and horizontal (e.g. left and right) axes in relation to the user. Speakers can be positioned separate from the vertically-oriented display as a method or integrated with the display using a frame system or within the housing of a display or television device itself.

12 Claims, 29 Drawing Sheets

(56) References Cited

U.S. PATENT DOCUMENTS

| | | | |
|---|---|---|---|
| 8,249,283 B2* | 8/2012 | Ando | H04S 7/308 381/17 |
| 8,345,883 B2 | 1/2013 | Takumai et al. | |
| 2005/0047617 A1* | 3/2005 | Lee | H04N 5/642 381/306 |
| 2005/0216126 A1* | 9/2005 | Koselka | B25J 5/007 700/259 |
| 2007/0047187 A1* | 3/2007 | Kumano | G06F 1/1601 361/679.06 |
| 2007/0169555 A1* | 7/2007 | Gao | H04R 1/403 73/620 |
| 2008/0092182 A1* | 4/2008 | Conant | H04N 7/17318 725/109 |
| 2008/0165992 A1* | 7/2008 | Kondo | H04N 7/0122 381/182 |
| 2008/0187155 A1* | 8/2008 | Hou | H04R 1/02 381/300 |
| 2010/0111336 A1* | 5/2010 | Jeong | H04R 5/04 381/306 |
| 2011/0002487 A1* | 1/2011 | Panther | H04R 5/04 381/300 |
| 2011/0150247 A1* | 6/2011 | Oliveras | G06F 1/1688 381/304 |
| 2012/0082332 A1 | 4/2012 | Park | |
| 2012/0134519 A1 | 5/2012 | Caldes et al. | |
| 2012/0170179 A1* | 7/2012 | Aumiller | G06F 1/1637 361/679.01 |
| 2013/0163787 A1 | 6/2013 | Moon | |
| 2013/0188821 A1* | 7/2013 | Schul | H04R 1/026 381/394 |
| 2013/0191753 A1* | 7/2013 | Sugiyama | G06F 3/165 715/727 |
| 2013/0230174 A1* | 9/2013 | Oliveras | H04R 5/04 381/17 |
| 2014/0086415 A1* | 3/2014 | Sim | G06F 1/1688 381/17 |
| 2014/0219482 A1* | 8/2014 | Jia | H04R 5/02 381/300 |
| 2014/0233771 A1 | 8/2014 | Giustina et al. | |

* cited by examiner

SURROUND SOUND APPLICATIONS AND DEVICES FOR VERTICALLY-ORIENTED CONTENT

CROSS-REFERENCE TO RELATED APPLICATION(S)

This application claims the benefit under 35 U.S.C. § 119 of the earlier filing date of U.S. Provisional Application Ser. No. 62/259,972 filed Nov. 25, 2015, the entire contents of which is hereby incorporated by reference in its entirety for any purpose.

TECHNICAL FIELD

Examples described herein relate to audiovisual formats, displays, and equipment arrangements for entertainment, information, educational, and/or other content.

BACKGROUND

Vertically-oriented content such as shows, movies and games, may be developing, and audio and other equipment configurations may be desired for surrounding vertically-oriented displays (e.g. televisions).

Historically, with visual arts such as painting and photography two primary formats exist: landscape for horizontally oriented images and portrait for vertically oriented images. With the advent of motion pictures, landscape became the dominant format primarily due to the standardization of technology, film formats, and the physical theater environment. Television followed motion pictures and adopted the landscape format for broadcasting motion pictures and in the creation of TV centric content. Over more recent years, computer technology has adopted the landscape screen format as well, except until recently with the emergence of smartphones.

Today's smartphones are outfitted with powerful video capabilities such as the iPhone 6s with 4K video resolution. Movie makers are now unconstrained by bulky recording equipment and, whether intentional or not, we are beginning to see a greater number of vertically-oriented videos. There are even some pioneers in this area; for instance in October 2014, the first "Vertical Film Festival" was held in Australia which only included movies and content in the vertical or portrait orientation.

All of the above Figures are arranged in accordance with examples described herein.

DESCRIPTION

Certain details are set forth below to provide a sufficient understanding of embodiments of the invention. However, it will be clear to one skilled in the art that embodiments of the invention may be practiced without various of these particular details. In some instances, well-known audio or other entertainment components, circuits, control signals, timing protocols, and software operations have not been shown in detail in order to avoid unnecessarily obscuring the described embodiments of the invention.

While vertically-oriented video content and movies are an exciting new area of artistic expression, traditional landscape formatted displays (e.g. televisions, computer displays, theater projectors) are not oriented to deliver a satisfying "big screen" (e.g. bigger than a smartphone of tablet screen) user experience. With today's widescreen 16:9 and 16:10 television and computer displays, vertically oriented videos utilize less than 35% of the available screen area.

For vertically oriented content, audio formats need to be rethought as well. Multichannel audio formats evolved over the years through the efforts of the recording and movie industries. Surround sound formats in particular were created for the physical movie theater environment and then later scaled down for home theater applications. The basic idea behind surround sound formats such as 5.1 and 7.1 is to surround the user with sound left to right and front to back creating an auditory user experience of a 360-degree environment larger than the screen itself. While this is usually effective, sometimes sounds coming from the side or behind the user can actually seem out of context and distract from the primary visual content. Some homeowners also have difficulty installing surround sound speakers due to room configuration and wiring limitations. Additionally, some homeowners are put off by the visual aesthetics of surround sound speaker systems as they desire to downplay the amount of tech devices, such as bulky speaker boxes, in their living space.

With vertically-oriented content an alternative to traditional surround sound speaker placement, left to right and front to back, would be to actually surround the vertically oriented screen with the discreet sound channels. This remapping of the sound channels may, in some examples, result in a more direct connection between the visual content and the audio soundtrack, providing an enhanced user experience. For example, the sound of footsteps in a movie or video may come from speakers located towards the bottom of the vertically-oriented screen while the sound of an airplane flying overhead may be mapped to speakers towards the top of the screen creating, in some examples, a one-to-one relationship between visual and audio content.

Figure 1:
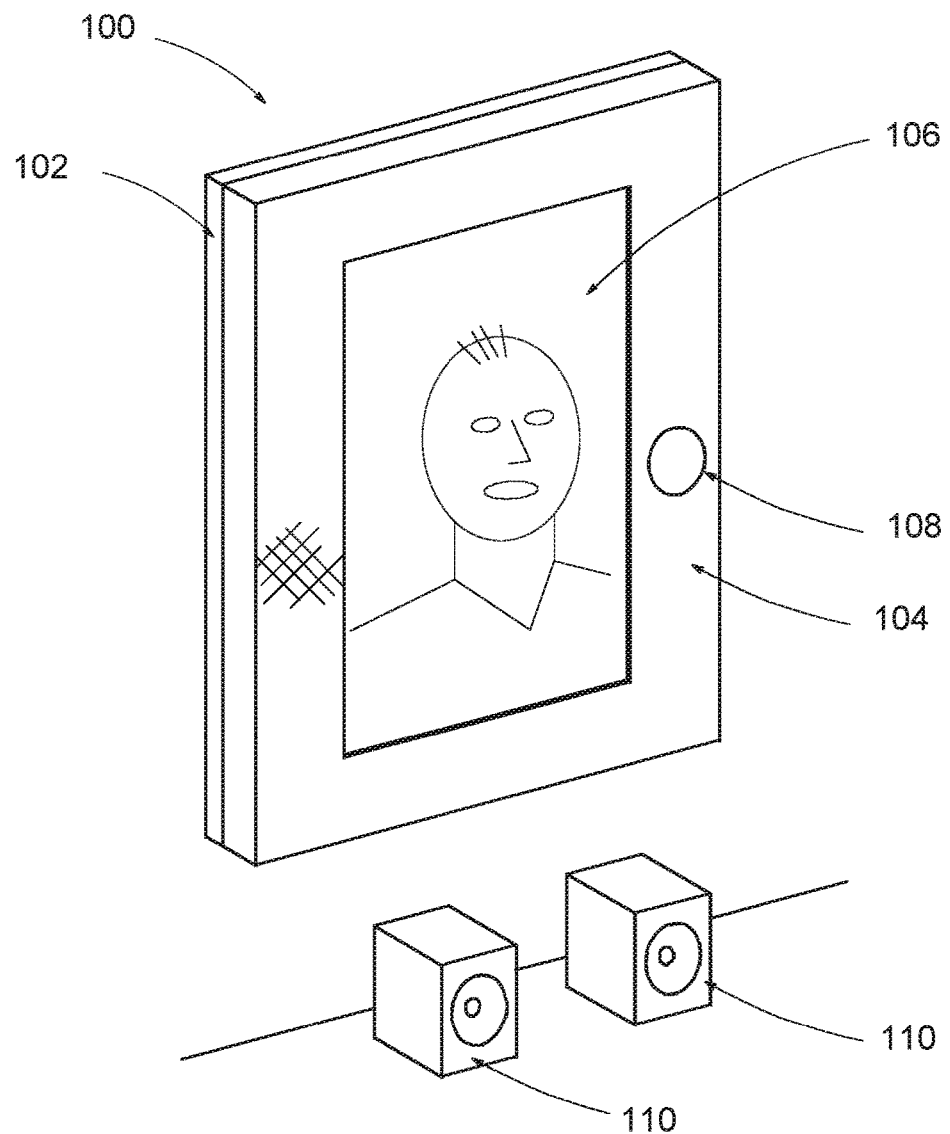
FIG. 1 is a perspective view of an audio frame for a vertically-oriented display.

FIG. 1 is an assembled view of an example audio frame, generally designated 100. The audio frame 100 may be mounted to the wall in some examples or the audio frame 100 could be mounted to a stand or easel type structure. Similar to a picture frame, the frame front 104 can take on many aesthetic variations from classic to modern. At least two general categories of structural examples capable of delivering audio user experiences for a vertically-oriented display 106 are described herein. The first may include a structure that is used to surround an existing display or television with speaker channels. The second general category may integrate speaker channels into the design and engineering of a newly manufactured display or television for vertically-oriented content viewing.

The audio frame 100 includes a rectangular frame back 102 and a mating rectangular frame front 104. The frame back 102 may allow the placement of one or multiple audio speakers (not shown) around the perimeter on the left and right sides and along the top and bottom frame members. Specific speaker numbers and placements may be selected to map to specific audio and surround sound formats such as stereo, 3.1, 5.1, 7.1, or others. The frame back 102 includes features and details that enable the mounting of a vertically-oriented display 106 (e.g., a television) as well as features and details that enable the entire audio frame assembly 100 to be mounted to a wall or a stand. The vertically-oriented display 106 screen can be standard aspect ratios such as, but not limited to, 4:3, 16:9, 1.85:1, 2.35:1, or custom sizes as long as the long axis is mounted vertically to an intended user viewpoint.

Examples of the frame front 104 may function to provide an aesthetic covering for the frame back 102 and to create a bezel around the vertically-oriented display 106. The frame front 104 may include openings 108 which are constructed of materials that will allow sound to pass through such as certain fabrics or have perforations or holes to achieve this function. Similar to a picture frame, the frame front 104 can take on many aesthetic variations from classic to modern. One or more low frequency emitters (LFE) 110 (e.g., a subwoofer) may be located below the audio frame 100.

The vertically-oriented display 106 may be mounted to the frame back 102 and sandwiched between the frame back 102 and the frame front 104. The vertically-oriented display 106 may be a standard aspect ratio such as, but not limited to, 4:3, 16:9, 1.85:1 or 2.35:1 or custom sizes as long as the long axis is mounted vertically to an intended user viewpoint.

It is intended that the audio frame 100 may be sized to fit a specific vertically-oriented display 106. In some examples, the audio frame 100 may have adjustable sections to fit various vertically-oriented displays 106 and in some examples the audio frame 100 may be custom made per the specification of the purchaser.

For reasons of simplicity, audio frames 100 in this document are illustrated with one opening 108. However, depending on the application multiple speakers and corresponding openings 108 may be assembled within a single audio frame 100 to achieve certain audio effects.

Figure 2:
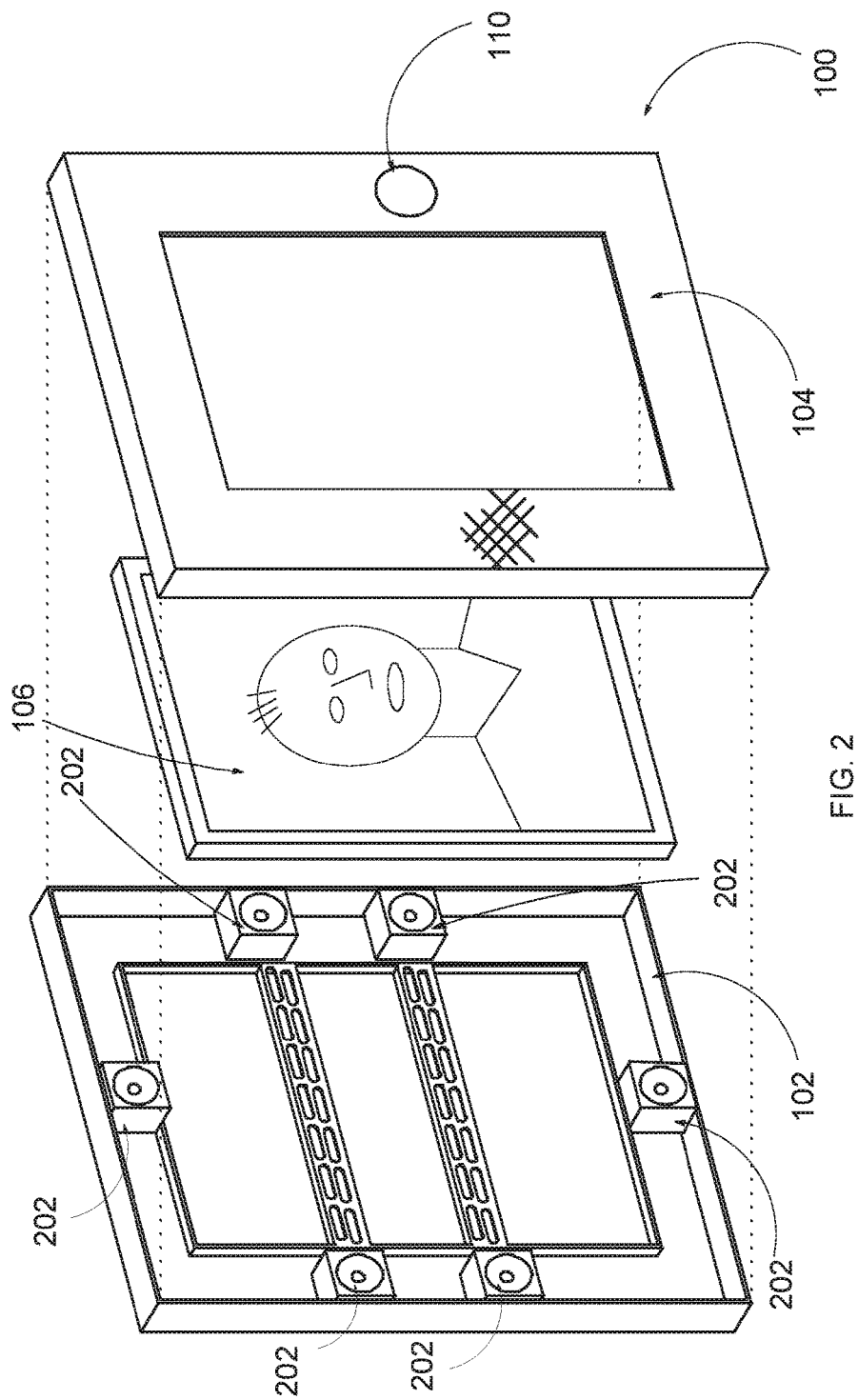
FIG. 2 is an exploded view of an audio frame for a vertically-oriented display.

FIG. 2 is an exploded view of an example audio frame 100. The audio frame 100 may provide a system of mounting a vertically-oriented display 106 and to deliver rich audio sound including voice, music, and sound effects around the perimeter of the vertically-oriented display 106. In some examples, a conventional display, used generally to deliver horizontally-oriented content, may be turned 90 degrees and mounted in audio frame 100 as described herein to improve the experience of a conventional display delivering horizontally-oriented content. By remapping traditional audio and surround sound formats such as stereo, 3.1, 5.1, 7.1, and more, the sound can be more closely linked in some examples to the content on the display. For example, sounds occurring from objects at a low level (e.g. near the bottom or lower end of the vertically-oriented display), such as footsteps or other sounds, may be emitted from speakers 202 near the lower portion of the audio frame 100, while sounds occurring from objects at a high level (e.g. near the top or upper end of the vertically-oriented display 106), such as an airplane flying overhead or other sounds, may be emitted from speakers 202 near the top portion of the audio frame 100.

Sounds in an audio or video source file may be associated with a particular speaker for playback in accordance with a vertical distance along the display from which the sound was intended to originate.

Typical display and television construction includes a rectangular frame back 102 and a mating rectangular frame front 104. With the audio frame 100, the frame back 102 and frame front 104 may be designed to allow the placement of one or multiple audio speakers 202 around the perimeter on the left and right sides and along the top and bottom of the vertically-oriented display 106. Specific speaker number and placement may be mapped to specific audio and surround sound formats such as stereo, 3.1, 5.1, 7.1, and more.

An example of the function of the frame front 104 may be to provide an aesthetic covering around the vertically oriented display or television screen. The frame front 104 may be constructed of materials that will allow sound to pass through such as certain fabrics or have openings, perforations, or holes to achieve this function. Similar to a picture frame, the frame front 104 can take on many aesthetic variations from classic to modern.

The vertically-oriented display 106 may be sandwiched between the frame back 102 and the frame front 104. The vertically-oriented display 106 screen can be a standard aspect ratio such as, but not limited to, 4:3, 16:9, 1.85:1, 2.35:1, or custom sizes as long as the long axis is mounted vertically to an intended user viewpoint.

For reasons of simplicity, speaker housings in this document are illustrated with one speaker. However, depending on the application multiple speakers can be assembled within a single housing to achieve certain audio effects.

Sounds in an audio or video source file may be associated with a particular speaker 202 for playback in accordance with a vertical distance along the vertically-oriented display 106 from which the sound was intended to originate.

Figure 3:
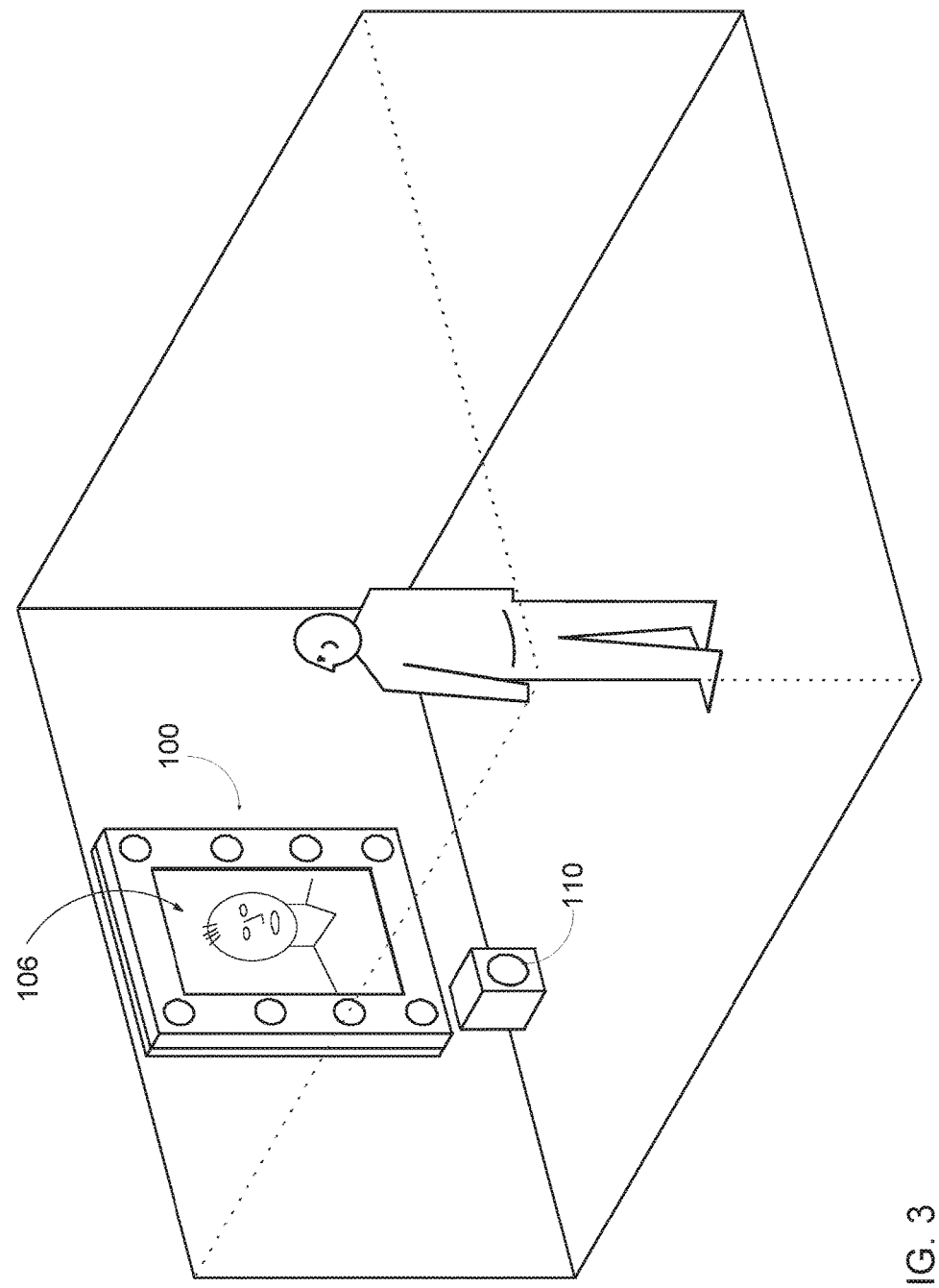
FIG. 3 is a perspective view of a mounted audio frame for a vertically-oriented display.

FIG. 3 illustrates an audio frame 100 with example speaker locations for a surround sound set-up for a vertically-oriented display 106. Speakers may be arranged around the perimeter of the vertically-oriented display 106. An LFE 110 may be located on or below the audio frame 100. Unlike many traditional surround sound systems, which place speakers horizontally around an observer, the audio frame 100 arranges speakers around the perimeter of the vertically-oriented display 106 to enable sound to be emitted toward an observer that is spatially varied vertically.

Figure 4:
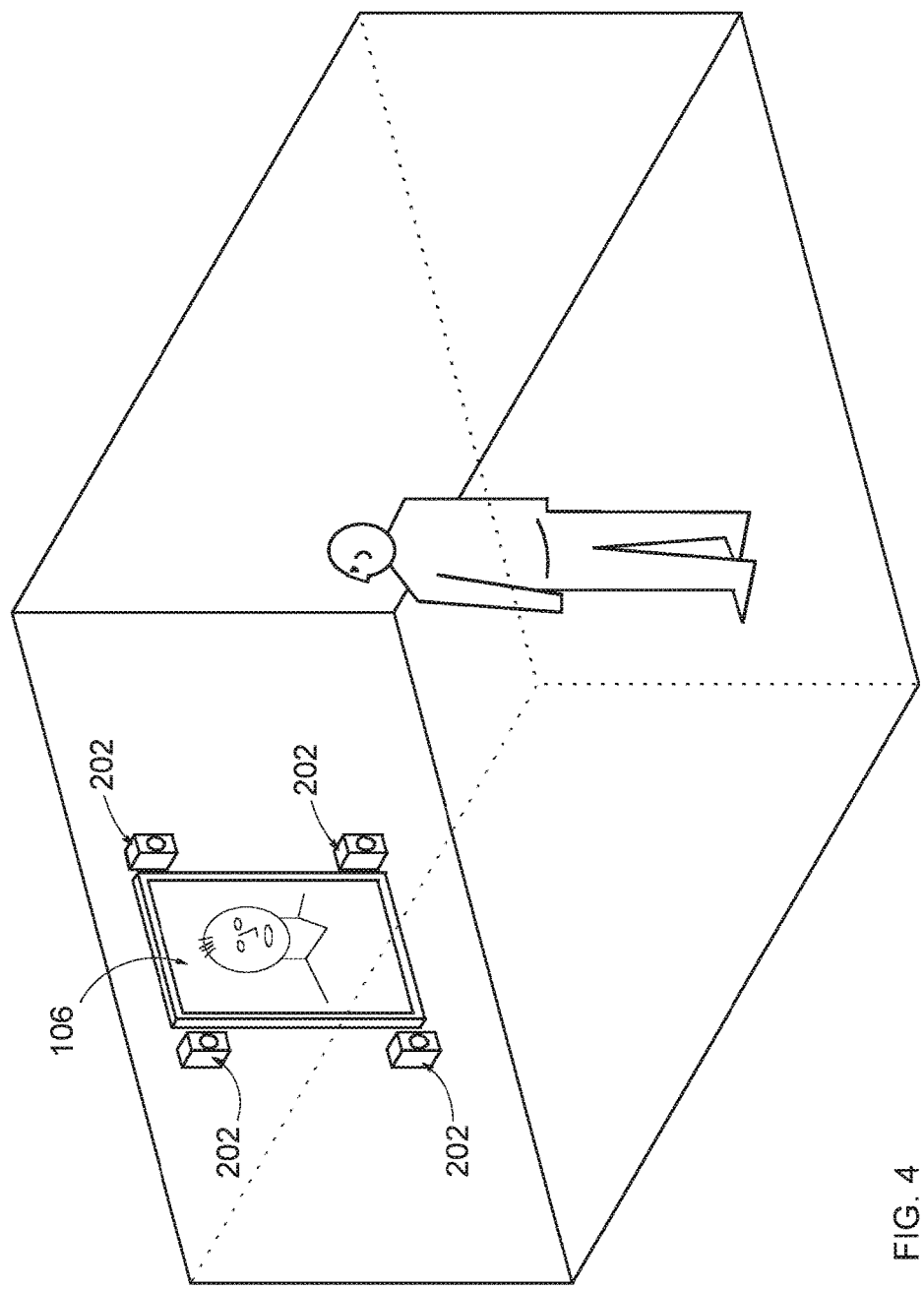
FIG. 4 illustrates locations for quadraphonic audio speaker placement around a vertically-oriented display.

Examples of quadraphonic audio applications are also described herein. FIG. 4 illustrates example locations for quadraphonic audio independent speaker 202 placement around a vertically-oriented display 106. Quadraphonic audio recordings began in the 1950s as one of the first examples of surround sound. The format has been superseded over the years and is rarely used today. However, the Quadraphonic format can deliver a unique, enhanced user experience when combined with a vertically-oriented display 106. The four independent channel speakers 202 surround the screen from left and right, and top and bottom to deliver audio that may more closely relate to the visual content.

Figure 5:
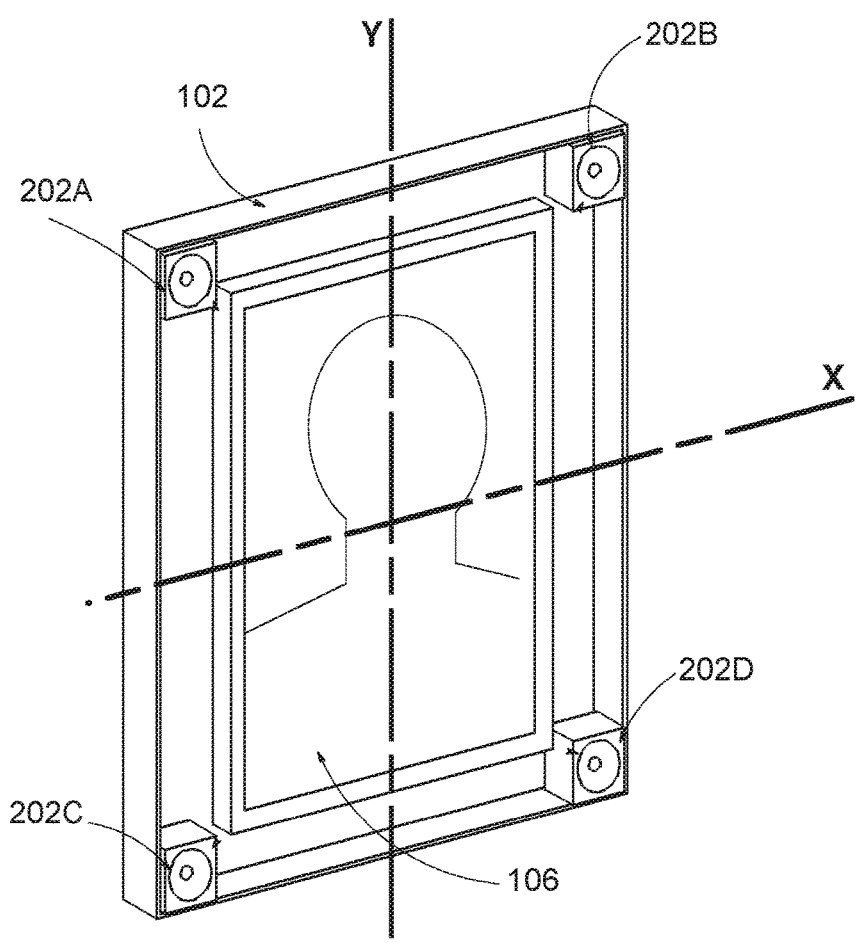
FIG. 5 illustrates locations for quadrophonic audio speakers in an audio frame for a vertically-oriented display.

In the example of FIG. 5, quadraphonic audio surround sound channels front left and right, and back left and right, are remapped to the designated top left and right, and bottom left and right channels in no particular pairing.

Top left channel speaker 202A and top right channel speaker 202B may be located in the upper corner areas of the frame back 102, and the bottom left channel speaker 202C and bottom right channel speaker 202D may be located in the lower corner areas of the frame back 102. With the creation of the content soundtrack (e.g. source audio), the audio designer or engineer can designate certain sounds be emitted from one or more of the speaker channels. For example, the sound of footsteps or other sounds occurring from objects at a low level (e.g. near the bottom of the vertically-oriented display) may be assigned to the bottom left and bottom right channel speakers 202C, 202D. The sound of an airplane flying overhead or other sounds occurring form objects at a high level (e.g. near the top of the vertically-oriented display) may be assigned to the top left and right channel speakers 202A, 202B with the sound panning from left to right or vice versa. The sound of a rocket liftoff, for example, may be concentrated primarily in the bottom left and right channel speakers 202C, 202D and then pan vertically to the top left and right channel speakers 202A, 202B as the rocket lifted skywards. Dialog may come from all four channel speakers 202A-D in some examples, but may be balanced left to right and top to bottom based on a location of the speaker 202 in the vertically-oriented display to give the effect of the dialog being emitted from the character's mouth.

Figure 6:
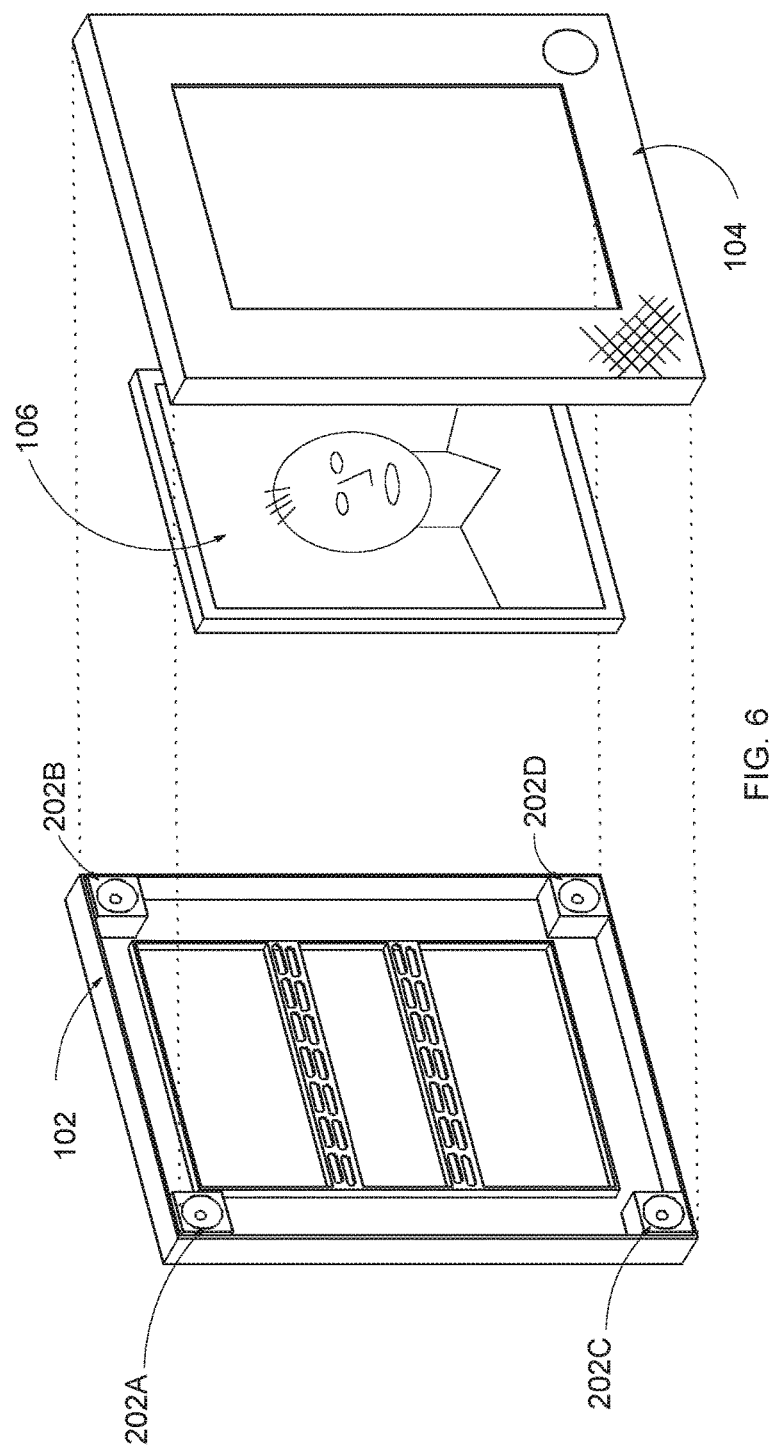
FIG. 6 illustrates quadraphonic audio speaker locations in relation to a vertically-oriented display for an example audio frame.

FIG. 6 illustrates example Quadraphonic speaker locations in relation to a vertically-oriented display 106 for an example audio frame 100. The four independent channel speakers 202 shown surround the audio frame 100 from left and right, and top to bottom.

For reasons of simplicity, speaker channels in FIG. 6 are illustrated with one speaker 202 per speaker housing. However, depending on the application multiple speakers 202, such as a tweeter and mid-range speaker, can be assembled within a single housing to achieve certain audio effects.

Examples of 3.1 channel audio applications are also described herein.

A 3.1 audio set-up can be considered an enhanced stereo system with the addition of the center channel and a LFE (subwoofer) channel, or a scaled down 5.1 system minus the surround left and right speakers. 3.1 audio has been widely adopted for use with traditional horizontally-oriented displays and televisions.

Figure 7:
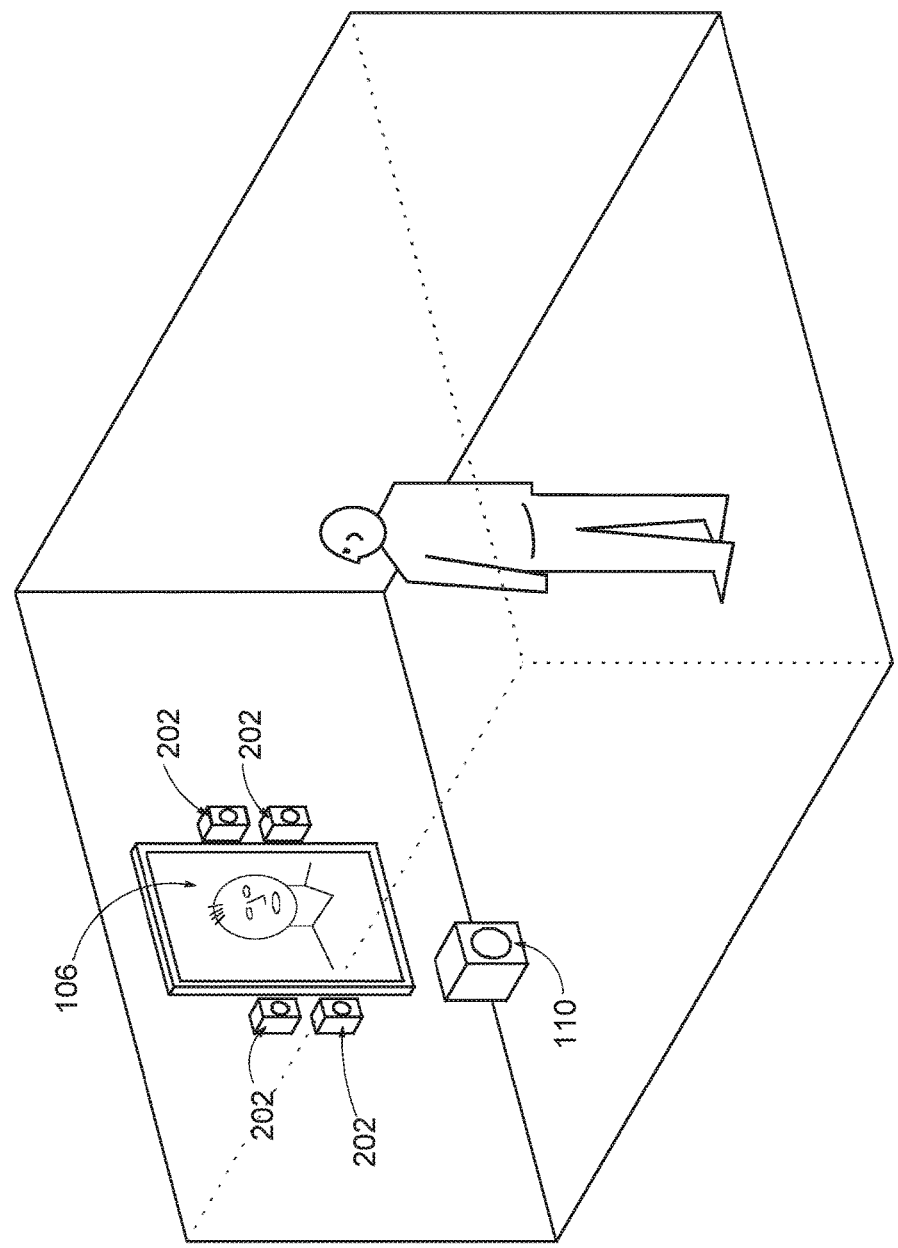
FIG. 7 illustrates locations for 3.1 channel audio speaker placement around a vertically-oriented display.

FIG. 7 illustrates example locations for 3.1 audio independent placement of speakers 202 around a vertically-oriented display 106. Center channel may be split into two separate speaker housings left and right of the vertically-oriented display 106 and may be augmented by the front left and right channels to deliver audio that more closely relates to the visual content. The LFE 110 may deliver deep bass effects.

Figure 8:
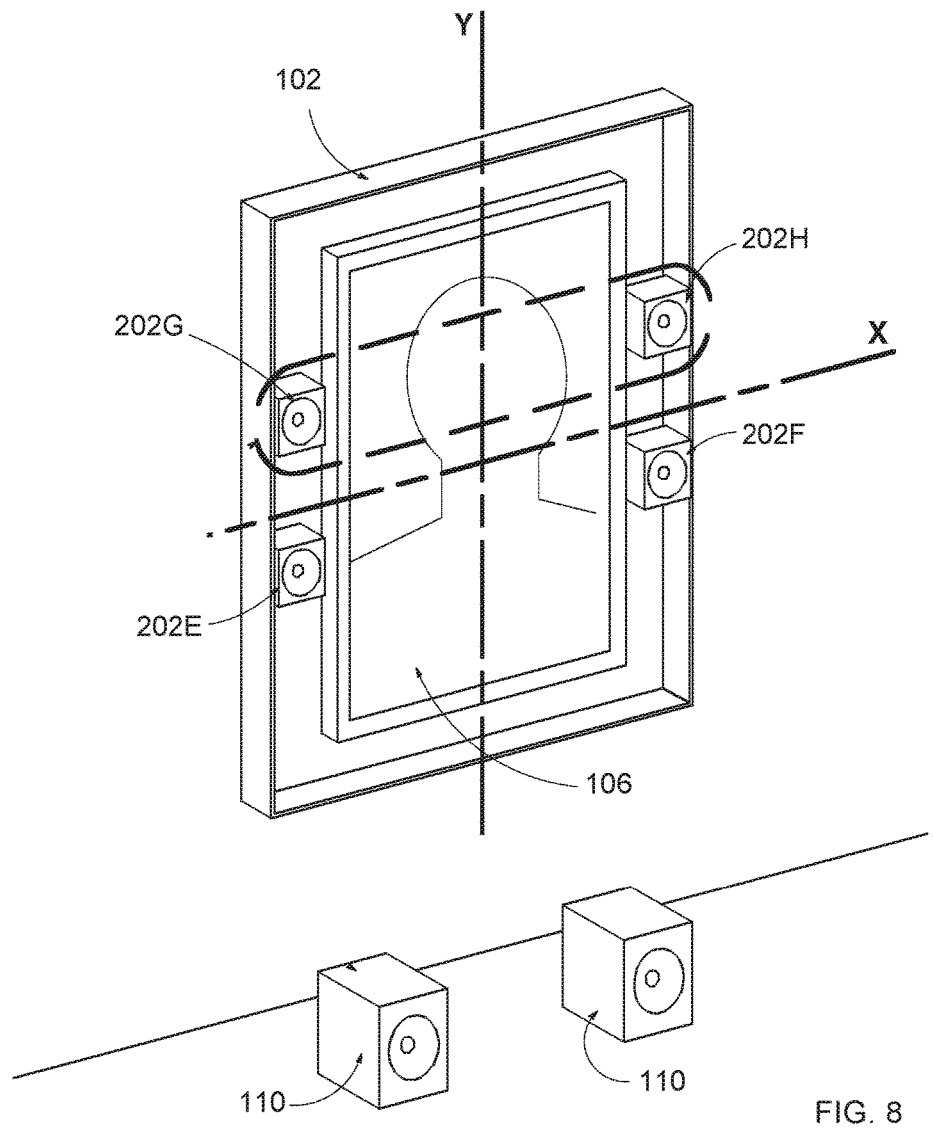
FIG. 8 illustrates locations for 3.1 channel audio speaker placement around a vertically-oriented display.

In the example embodiment of FIG. 8, traditional 3.1 audio surround sound channels, front left channel speaker and right, are remapped to the middle left and right channels. The center channel is divided into two separate speaker housings located left and right of the vertically-oriented display 106. The LFE channel mapping is unchanged and delivered to a separate floor standing housing.

Middle left channel and right channel speakers 202E and 202F may be located between the x-axis and the bottom of the frame back 102. The center channel speakers 202G and 202H may be located between the x-axis and the top of the frame back 102. With the creation of the content soundtrack, an audio designer or engineer can designate certain sounds be emitted from one or more of the speakers 202E-H. For example, dialog may come primarily from the center channel speakers 202G and 202H, but may be augmented by the middle left and right channel speakers 202E and 202F in accordance with a speaker's position in the display to give the effect of the dialog being emitted from the character's mouth along the x-axis. The sound of a cement truck moving across the screen may be assigned to the middle left and right channel speakers 202E and 202F with the sound panning from left to right or vice versa. The deep rumbling sounds of the cement truck may be assigned to the LFE 110.

For reasons of simplicity, speaker channels in FIG. 8 are illustrated with one speaker per housing. However, depending on the application multiple speakers, such as a tweeter and mid-range speaker, can be assembled within a single housing to achieve certain audio effects. The vertically-oriented display 106 screen can be standard aspect ratios such as, but not limited to, 4:3, 16:9, 1.85:1, 2.35:1, or custom sizes as long as the long axis is mounted vertically to an intended user viewpoint.

Figure 9:
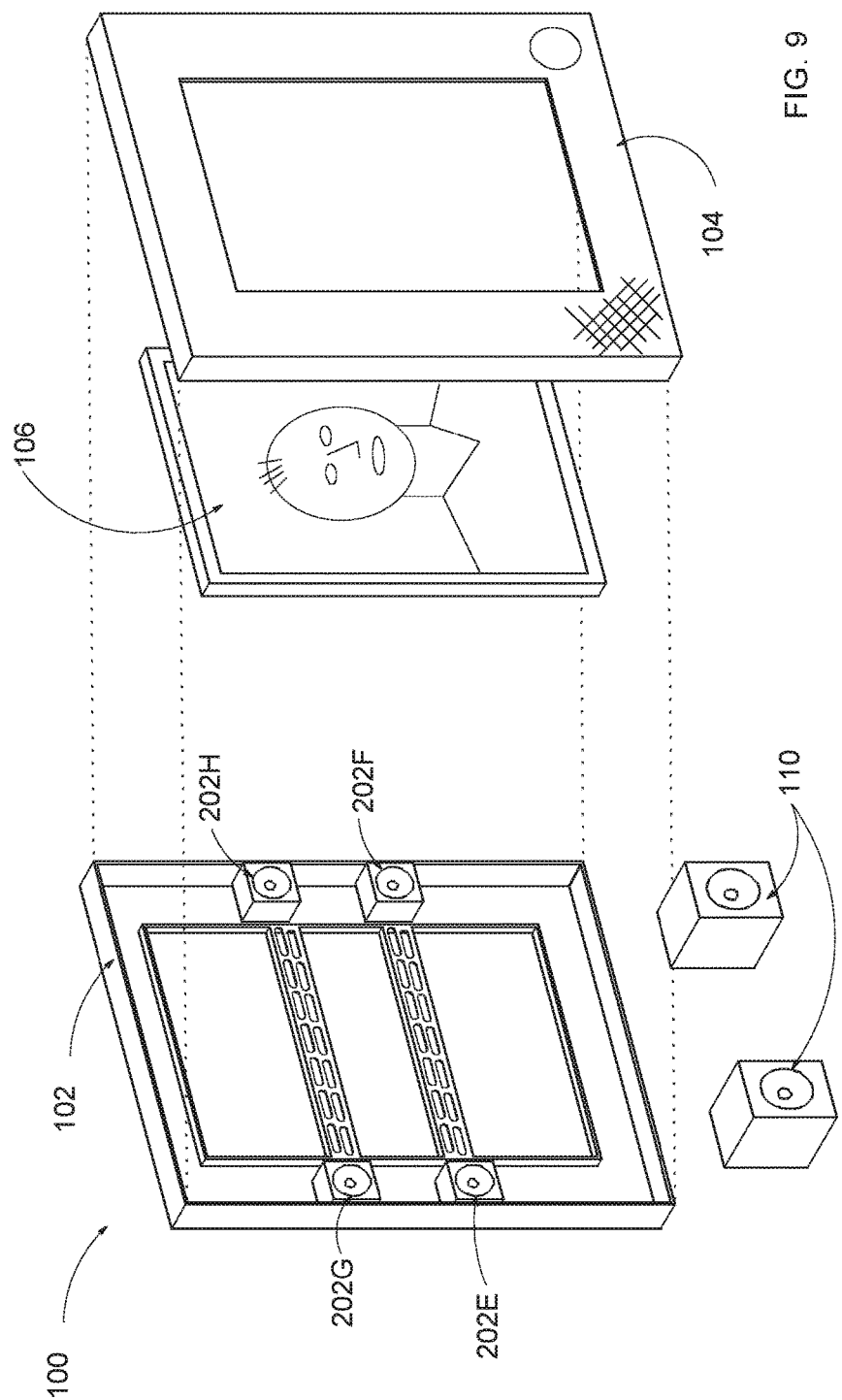
FIG. 9 illustrates 3.1 channel speaker locations in relation to a vertically-oriented display for an example audio frame.

FIG. 9 illustrates example 3.1 audio speaker locations in relation to a vertically-oriented display 106 for an example audio frame 100. The three independent channel speakers (center channel speakers 202G and 202H, middle channel speakers 202E and 202F, and LFE 110) surround the audio frame 100 from left and right, and top to bottom.

Examples of four channel surround audio applications are also described herein.

4 Channel audio was developed in the 1970s for the movie industry. The format has been superseded over the years and is rarely used today. However, the 4 Channel format may, in some examples, deliver a unique enhanced user experience when combined with a vertically-oriented display 106.

Figure 10:
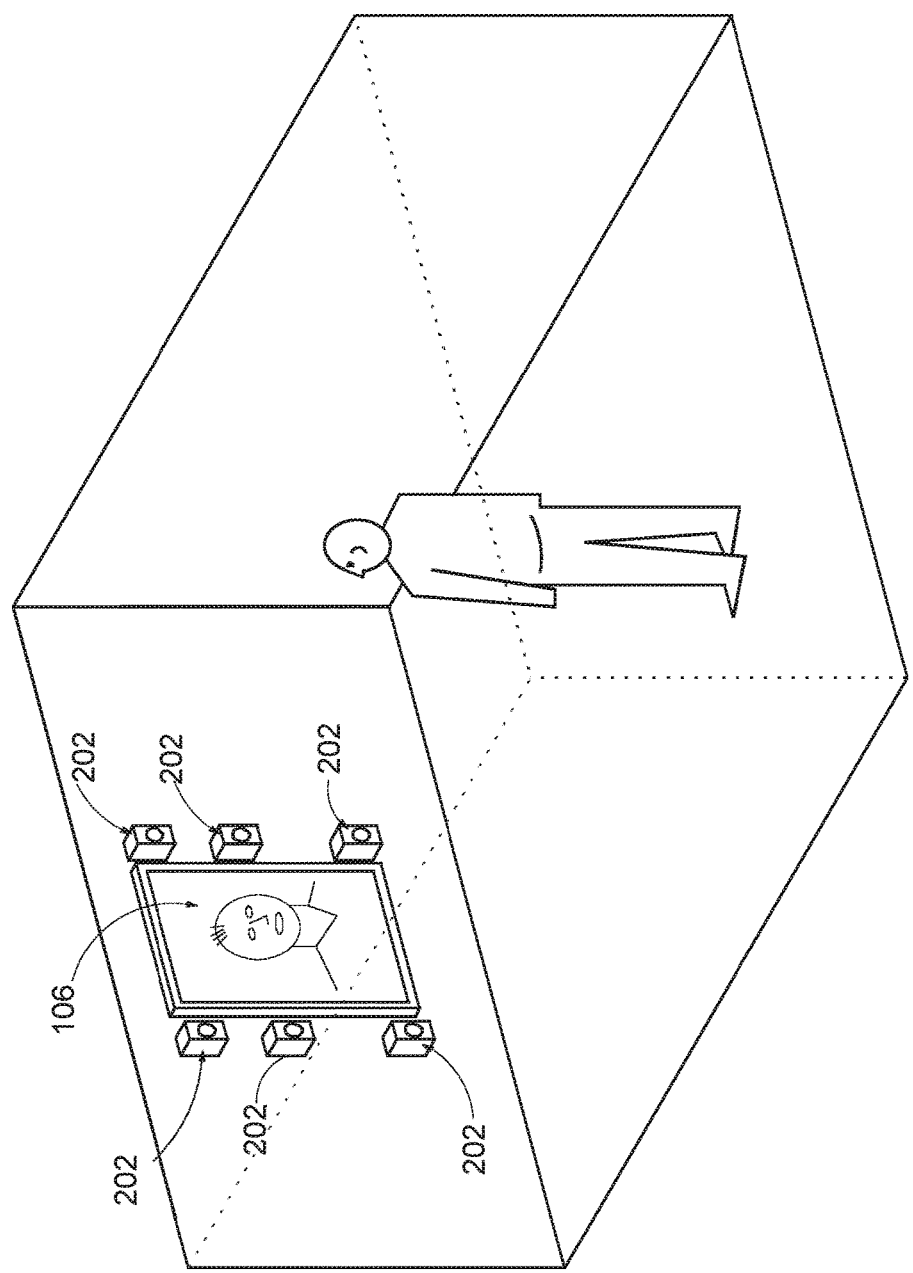
FIG. 10 illustrates locations for 4 channel speaker placement around a vertically-oriented display.

FIG. 10 illustrates example locations for 4 Channel audio independent speaker placement around a vertically-oriented display 106. The four independent channel speakers 202 surround the vertically-oriented display 106 from left and right, and top and bottom to deliver audio in some examples that may more closely relate to the visual content.

Figure 11:
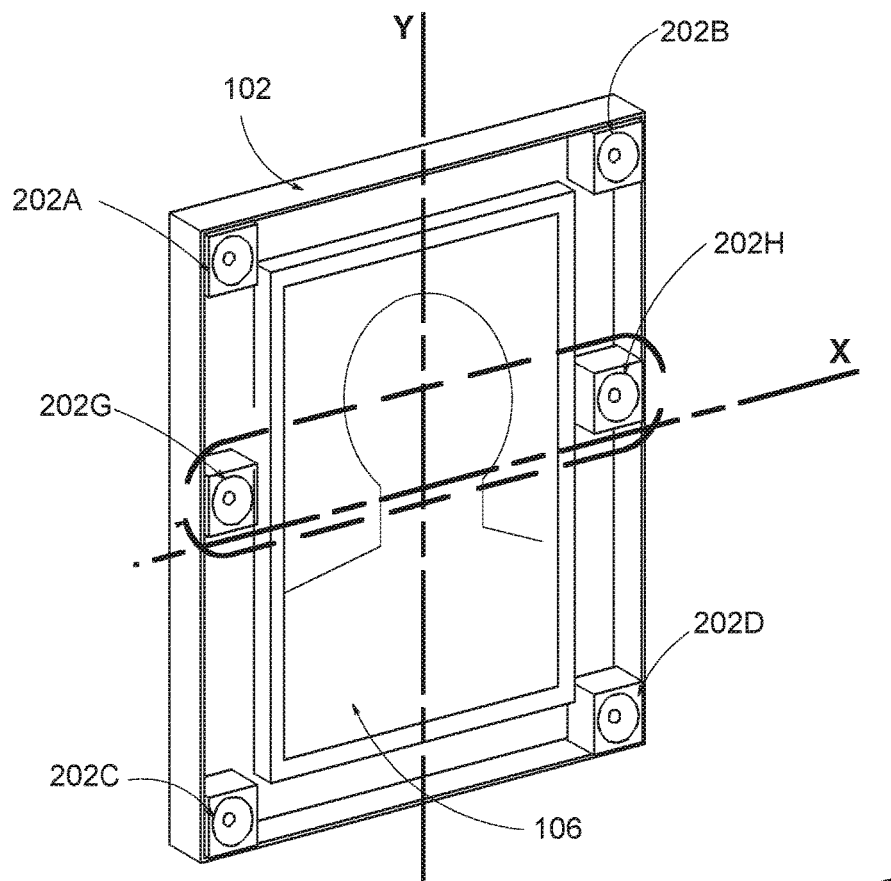
FIG. 11 illustrates locations for 4 channel audio speakers in an audio frame for a vertically-oriented display.

In the embodiment of FIG. 11, traditional 4 Channel audio surround sound channels, front left and right, are remapped to the designated top left and right channels. The surround left and right is remapped to the bottom channel, left and right side. The center channel is divided into two separate speaker housings located left and right of the vertically-oriented display 106.

Top left and right channel speakers 202A and 202B may be located in the upper corner areas of the frame back 102. The center channel speakers 202G and 202H may be located between the x-axis and the upper corners of the frame back 102. The bottom channel left and right speakers 202C and 202D may be located in the lower corner areas of the frame back 102. With the creation of the content soundtrack, the audio designer or engineer can designate certain sounds be emitted from one or more of the speakers 202A-H. For example, the sound of an airplane flying overhead or other sounds occurring form objects at a high level (e.g. near the top of the vertically-oriented display 106) may be assigned to the top left and right channel speakers 202A and 202B with the sound panning from left to right or vice versa. The sound of a rocket liftoff (or other sound travelling from a bottom of the display toward a top of the vertically-oriented display 106) may be concentrated primarily in the bottom channel speakers 202C and 202D, and then pan vertically to the center channel speakers 202G and 202H, and then to the top left and right channel speakers 202A and 202B as the rocket lifts skywards. Dialogue may come primarily from the center channel speakers 202G and 202H with augmentation from the other speakers based on a horizontal position of the speakers 202 relative to the vertically-oriented display 106 to give the effect in some examples of the dialogue being emitted from the character's mouth.

For reasons of simplicity, speakers 202 in FIG. 11 are illustrated with one speaker per housing. However, depending on the application multiple speakers 202, such as a tweeter and mid-range speaker, can be assembled within a single housing to achieve certain audio effects.

The vertically-oriented display 106 screen can be standard aspect ratios such as, but not limited to, 4:3, 16:9, 1.85:1, 2.35:1, or custom sizes as long as the long axis is mounted vertically to the user.

Figure 12:
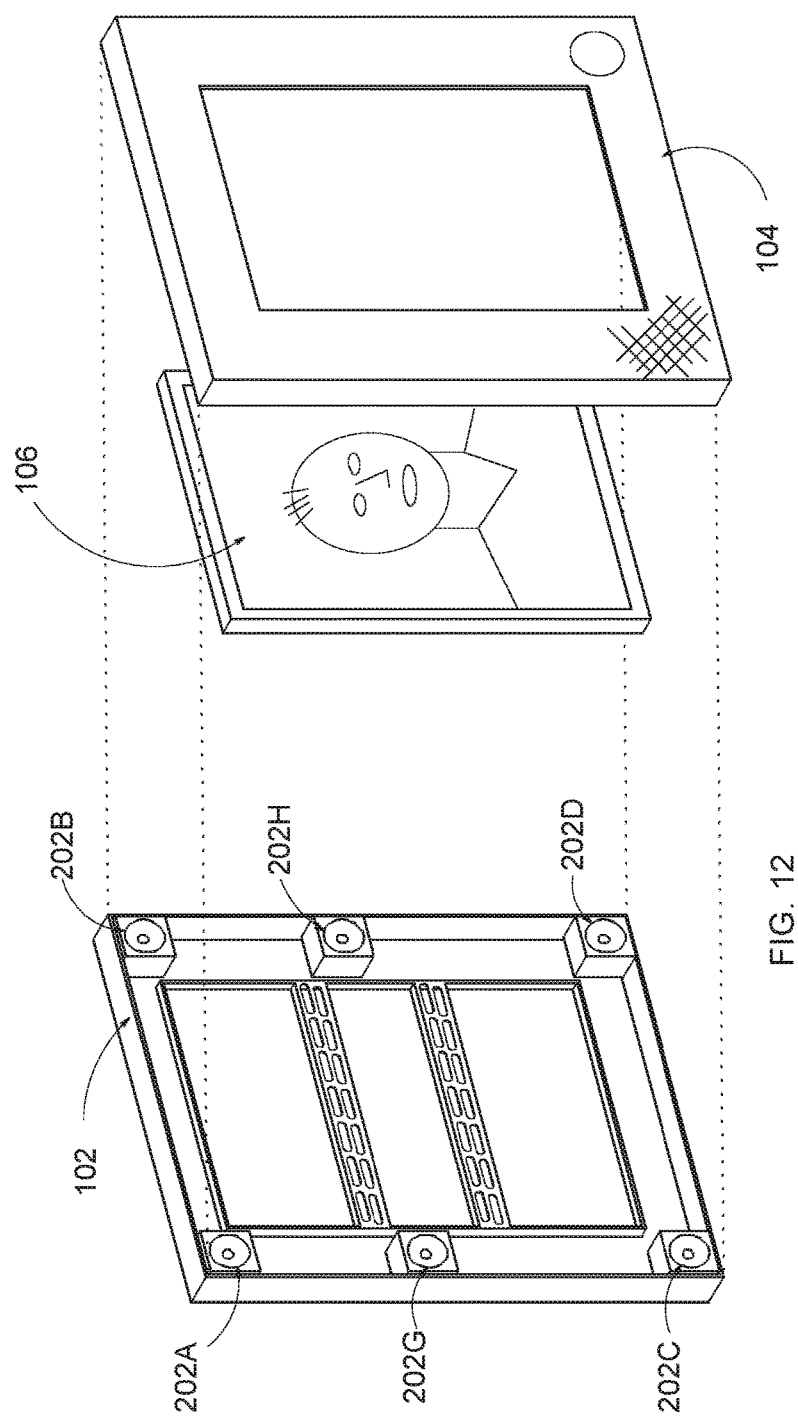
FIG. 12 illustrates 4 channel audio speaker locations in relation to a vertically-oriented display for an example audio frame.

FIG. 12 illustrates example 4 Channel audio speaker locations in relation to a vertically-oriented display 106 for an example audio frame 100. The independent channel speakers 202A-H surround the audio frame 100 from left and right, and top to bottom.

Examples of 5.1 channel surround audio applications are also described herein.

The 5.1 audio set-up was developed in the 1990s for the movie industry. The format is still widely used today, especially for home theater applications. When remapped to a vertically-oriented display 106, examples of advance surround sound formats, such as 5.1, may deliver a unique and enhanced user audio experience.

Figure 13:
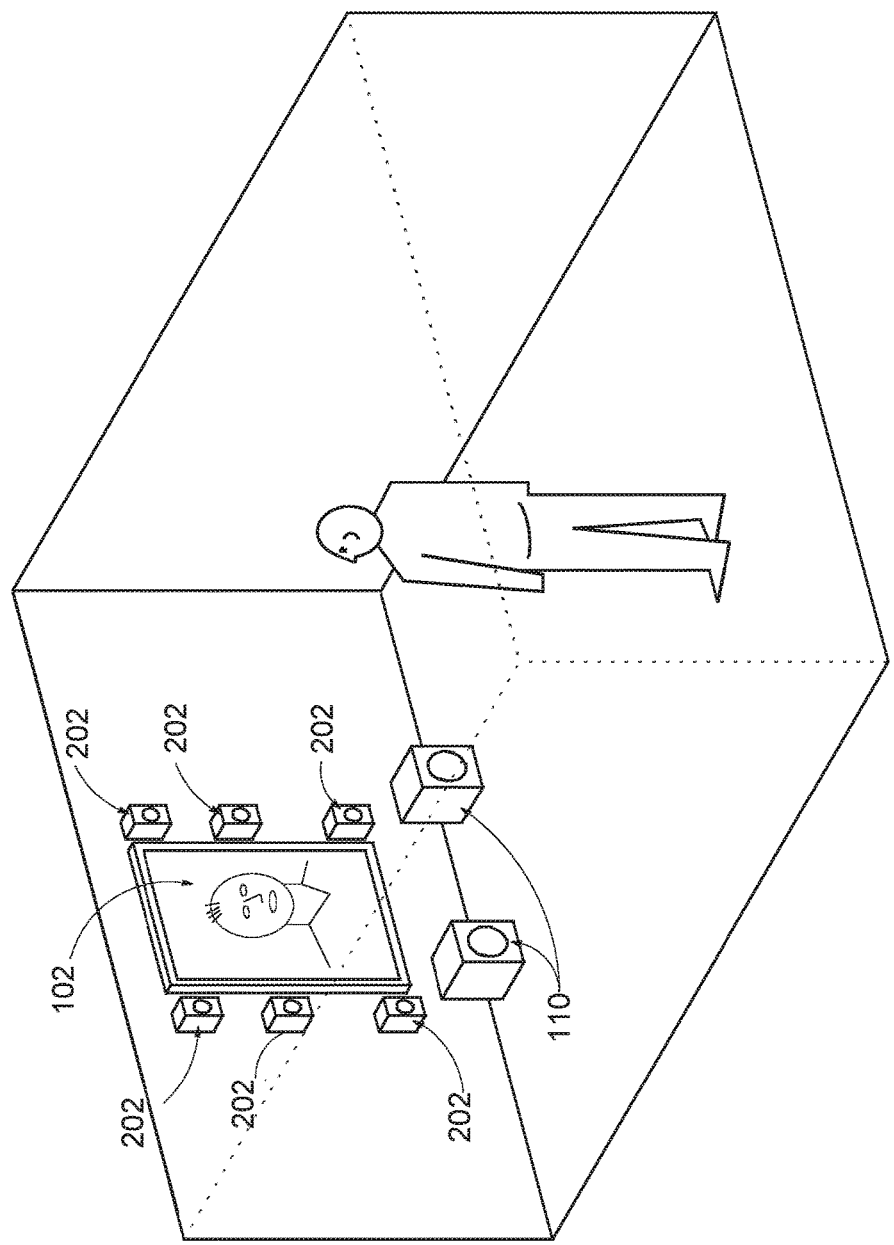
FIG. 13 illustrates example locations for 5.1 channel audio speaker placement around a vertically-oriented display.

FIG. 13 illustrates the example locations for 5.1 audio independent speaker placement around a vertically-oriented display 106. The independent channel speakers 202 and LFE 110 surround the screen from left and right, and top and bottom to deliver audio that may in some examples more closely relate to the visual content.

Figure 14:
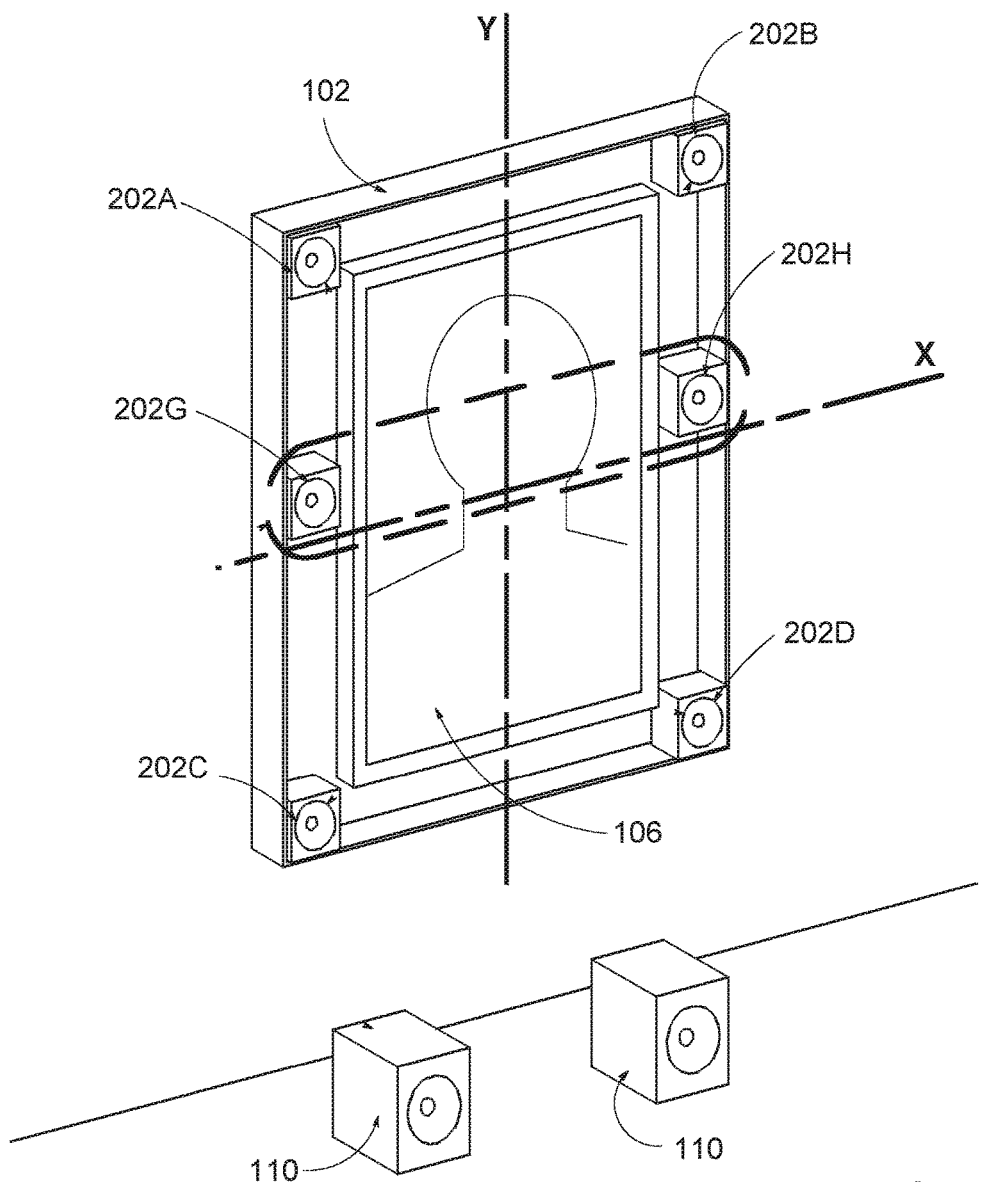
FIG. 14 illustrates locations for 5.1 channel audio speakers in an audio frame for a vertically-oriented display.

In the embodiment of FIG. 14, traditional 5.1 audio surround sound channels front left and right and surround left and right are remapped to the designated top left and right and bottom left and right channels in no particular pairing. The center channel is divided into two separate speaker housings located left and right of the vertically-oriented display 106. The LFE (subwoofer) channel mapping is unchanged and delivered to a separate floor standing housing.

Top left and right channel speakers 202A and 202B may be located in the upper corner areas of the frame back 102. The center channel speakers 202G and 202H may be located between the x-axis and the upper corners of the frame back 102. The bottom left and right channel speakers 202C and D may be located in the lower corner areas of the frame back 102. With the creation of the content soundtrack, the audio designer or engineer can designate certain sounds be emitted from one or more of the speakers 202. For example, the sound of footsteps or other sounds occurring from objects at a low level (e.g. near the bottom of the vertically-oriented display 106) may be assigned to the bottom left and bottom right channel speakers 202C and 202D. The sound of an airplane flying overhead or other sounds occurring from objects at a high level (e.g. near the top of the vertically-oriented display 106) may be assigned to the top left and right channel speakers 202A and 202B with the sound panning from left to right or vice versa. The sound of a rocket liftoff, or other sound coming from the bottom of the vertically-oriented display 106 and travelling upward, may be concentrated primarily in the bottom left and right channel speakers 202C and 202D, and then pan vertically through the center channel speakers 202G and 202H, and then to the top left and right channel speakers 202A and 202B as the rocket lifted skywards. Dialogue may come primarily from the center channel speakers 202G and 202H with augmentation from the other 4 channel speakers 202A-D in accordance with the position of the speaker on the vertically-oriented display 106 to give the effect in some examples of the dialogue being emitted from the character's mouth.

For reasons of simplicity, speakers 202 in FIG. 14 are illustrated with one speaker per housing. However, depending on the application multiple speakers 202, such as a tweeter and mid-range speaker, can be assembled within a single housing to achieve certain audio effects. The vertically-oriented display 106 can be standard aspect ratios such as, but not limited to, 4:3, 16:9, 1.85:1, 2.35:1, or custom sizes as long as the long axis is mounted vertically to an intended viewpoint of the user.

Figure 15:
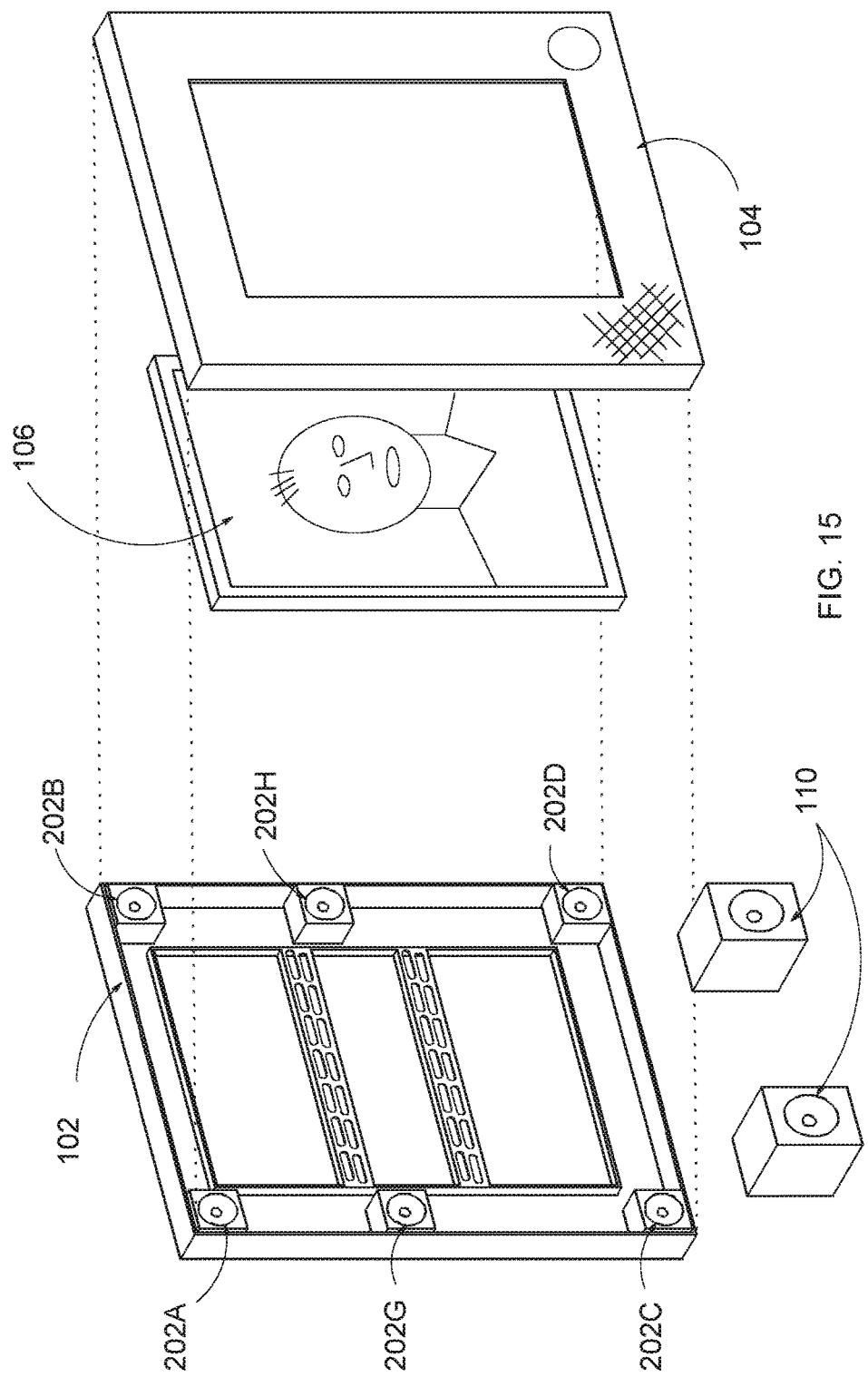
FIG. 15 illustrates 5.1 channel audio speaker locations in relation to a vertically-oriented display for an example audio frame.

FIG. 15 illustrates example 5.1 audio speaker locations in relation to a vertically-oriented display 106 for an example audio frame 100. The five independent channel speakers 202 surround the audio frame 100 from left and right, and top to bottom.

Examples of 6.1 surround audio applications are also described herein.

6.1 audio grew out of advancements with the 5.1 audio format by adding a surround back channel. The format is rarely used today as users generally either prefer the lesser 5.1 audio format or the enhanced 7.1 audio format. However, the 6.1 audio format in some examples may deliver a unique enhanced user experience when combined with a vertically-oriented display 106.

Figure 16:
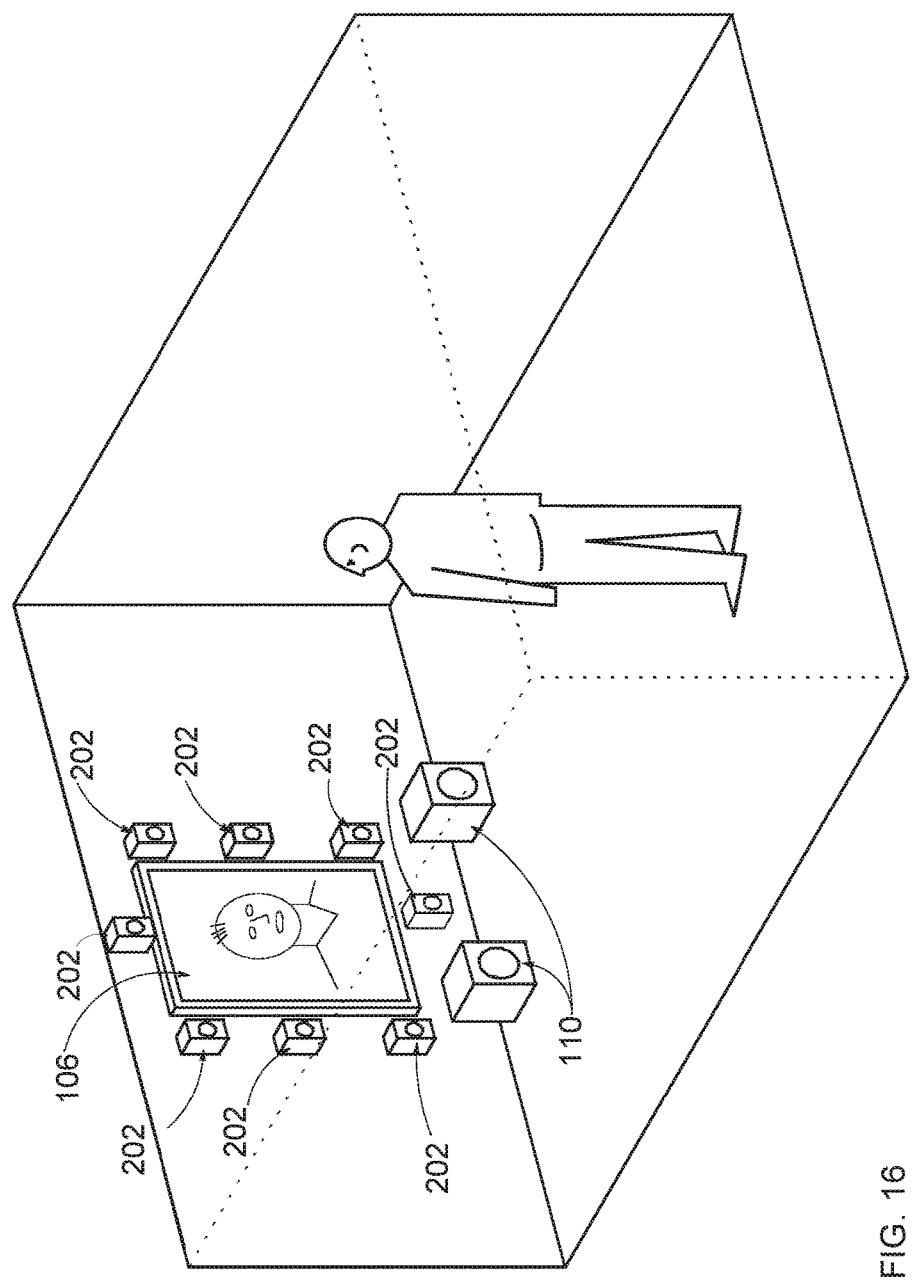
FIG. 16 illustrates locations for 6.1 channel audio speaker placement around a vertically-oriented display.

FIG. 16 illustrates example locations for 6.1 audio independent speaker placement around a vertically-oriented display 106. The six independent channel speakers 202 and two LFEs 110 surround the screen from left and right, and top and bottom to, in some examples, deliver audio that may more closely relates to the visual content.

Figure 17:
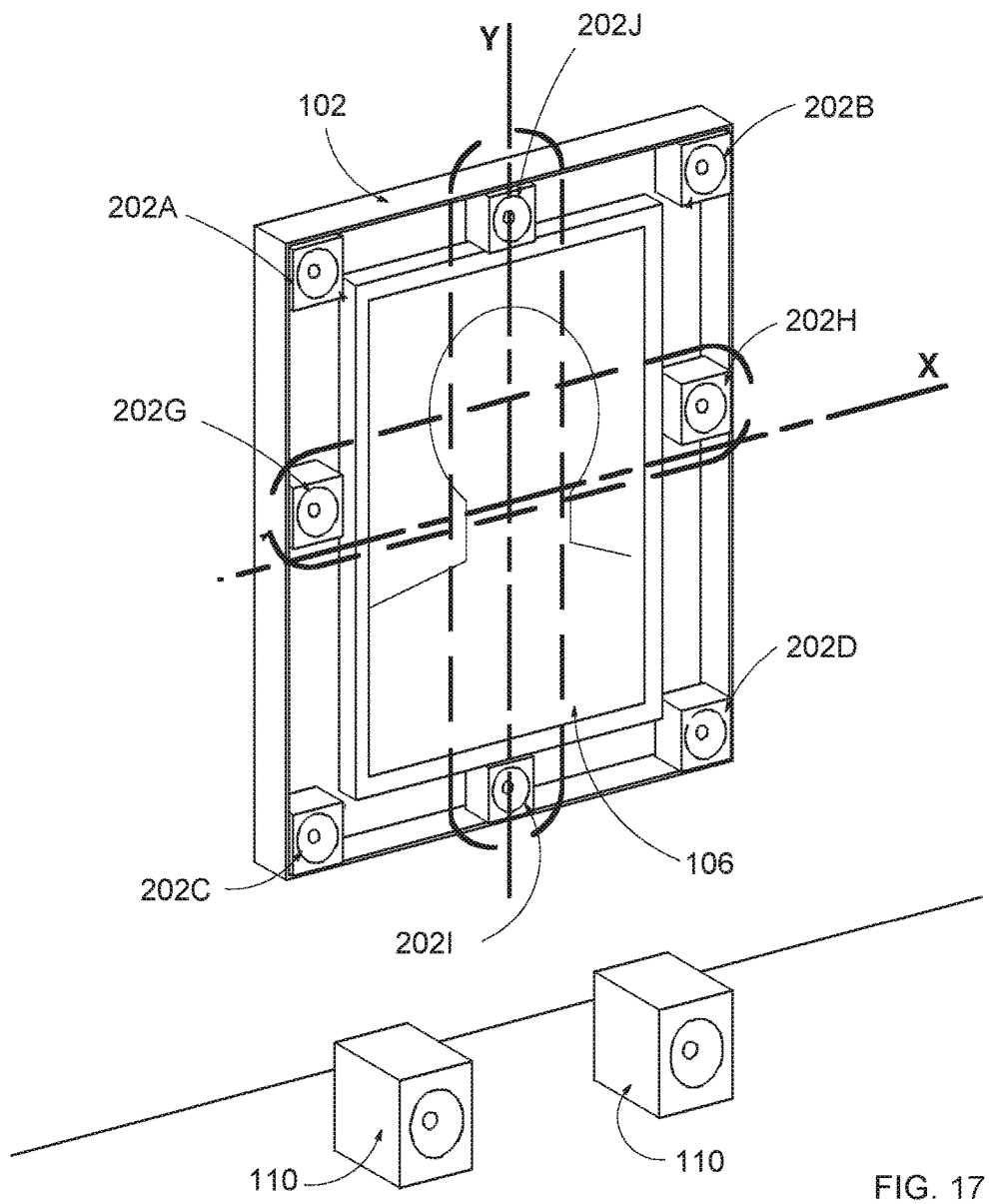
FIG. 17 illustrates locations for 6.1 channel audio speakers in an audio frame for a vertically-oriented display.

In the embodiment of FIG. 17, traditional 6.1 audio surround sound channels front left and right, and surround left and right are remapped to the designated top left and right, and bottom left and right channels in no particular pairing. The surround back channel may be divided into two separate speaker housings and remapped to the bottom center and top center channel locations above and below the vertically-oriented screen. The center channel may be divided into two separate speaker housings located left and right of the vertically-oriented display 106. The LFE (subwoofer) channel mapping is unchanged and delivered to a separate floor standing housing.

Top left and right channel speakers 202A and 202B may be located in the upper corner areas of the frame back 102. The center channel speakers 202G and 202H may be located between the x-axis and the upper corners of the frame back 102. The bottom left and right channel speakers 202C and 202D may be located in the lower corner areas of the frame back 102. The bottom center and top center channel speakers 202I and 202J may be located below and above the vertically-oriented display 106, respectively, along the vertical y-axis. With the creation of the content soundtrack, the audio designer or engineer can designate certain sounds be emitted from one or more of the speakers 202. For example, the sound of footsteps or other sounds occurring from objects at a low level (e.g. near the bottom of the vertically-oriented display 106) may be assigned to the bottom left and bottom right channel speakers 202C and 202D and/or the bottom center channel speaker 202I. The sound of an airplane flying overhead or other sounds occurring from objects at a high level (e.g. near the top of the vertically-oriented display 106) may be assigned to the top left and right channel speakers 202A and 202B and/or the top center channel speaker 202J with the sound panning from left to right or vice versa. The sound of a rocket liftoff, or other sound occurring from an object moving from a lower portion to a higher portion of the vertically-oriented display, may be concentrated primarily in the bottom left and right channel speakers 202C and D and/or the bottom center channel speaker 202I, and then pan vertically through the center channel speakers 202G and 202H, and then to the top left and right channel speakers 202A and 202B and/or the top center channel speaker 202J as the rocket lifted skywards. Dialogue may come primarily from the center channel speakers 202G and 202H with augmentation from the other speakers 202A-D, 202I, and 202J in accordance with the position of the speaker on the display to give the effect in some examples of the dialogue being emitted from the character's mouth.

For reasons of simplicity, speaker channels in this FIG. are illustrated with one speaker per housing. However, depending on the application multiple speakers 202, such as a tweeter and mid-range speaker, can be assembled within a single housing to achieve certain audio effects. One or more LFEs 110 may be positioned below the vertically oriented display 106.

The vertically-oriented display 106 screen can be standard aspect ratios such as, but not limited to, 4:3, 16:9, 1.85:1, 2.35:1, or custom sizes as long as the long axis is mounted vertically to the user.

Figure 18:
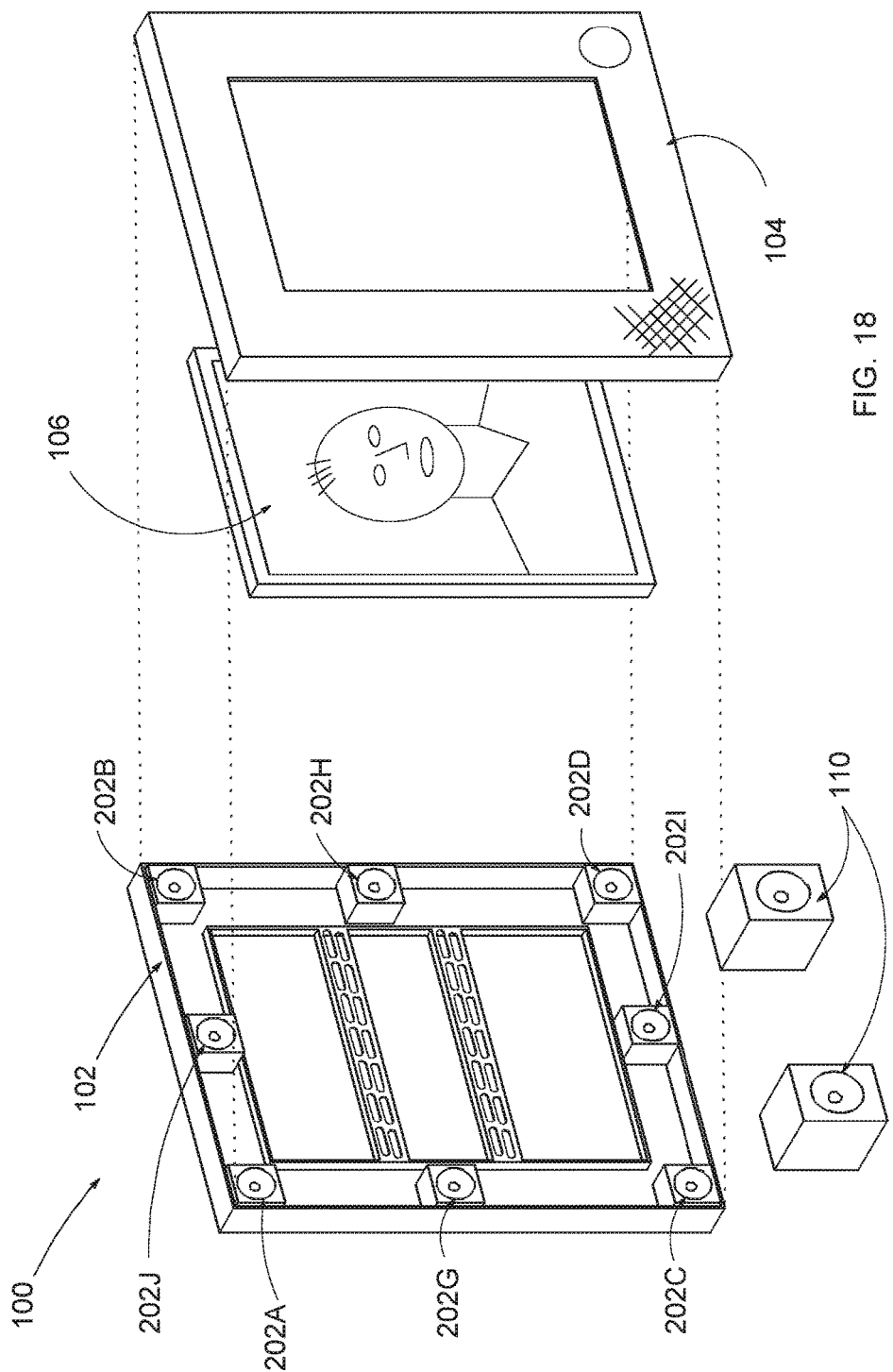
FIG. 18 illustrates 6.1 channel audio speaker locations in relation to a vertically-oriented display for an example audio frame.

FIG. 18 illustrates example 6.1 audio speaker locations in relation to a vertically-oriented display 106 for an example audio frame 100. The six independent channel speakers 202A-J surround the audio frame 100 from left and right, and top to bottom.

Examples of 7.1 channel surround audio applications are also described herein.

The 7.1 audio format was introduced in the 2000s and remains a primary example of surround sound. Many home theaters are set-up to deliver 7.1 audio from movies on Blu-ray disc. When remapped to a vertically-oriented display 106, advance surround sound formats such as 7.1 may deliver, in some examples, a unique and enhanced user audio experience.

Figure 19:
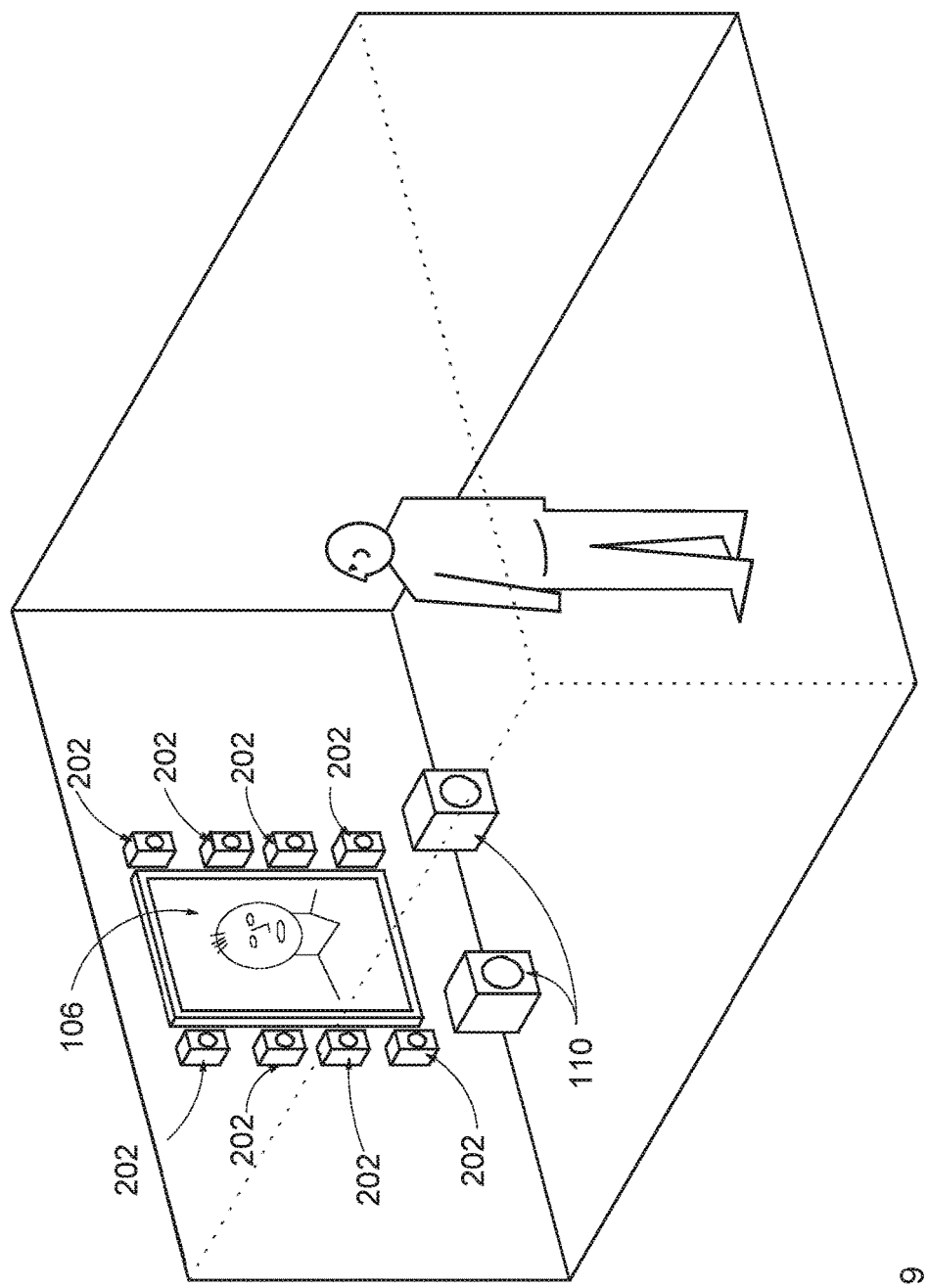
FIG. 19 illustrates locations for 7.1 channel audio speaker placement around a vertically-oriented display.

FIG. 19 illustrates example locations for 7.1 audio independent speaker placement around a vertically-oriented display 106. The seven independent channel speakers 202 surround the screen from left and right, and top and bottom to deliver in some examples audio that may more closely relates to the visual content.

Figure 20:
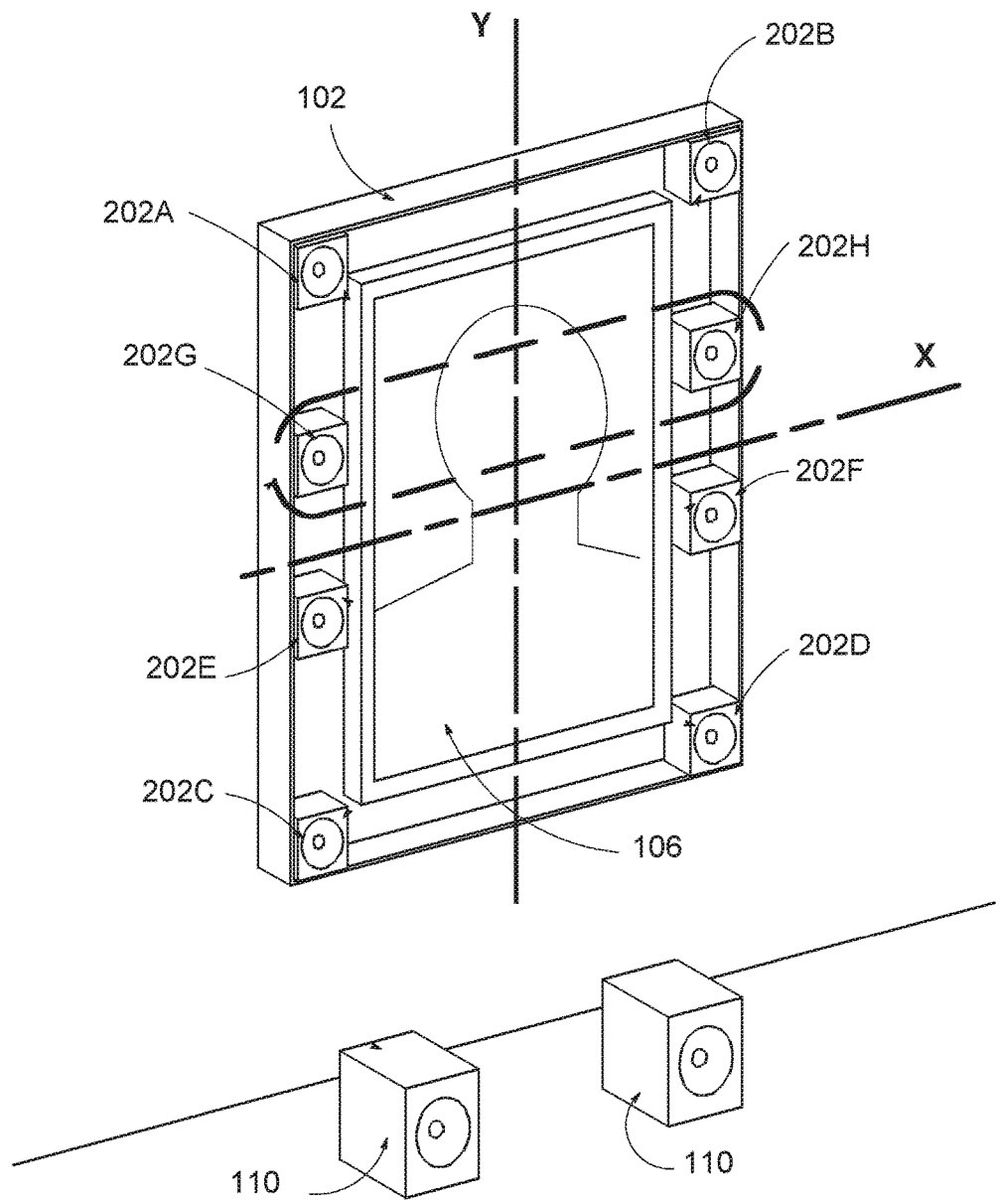
FIG. 20 illustrates locations for 7.1 channel audio speakers in an audio frame for a vertically-oriented display.

In the embodiment of FIG. 20, traditional 7.1 audio surround sound channels front left and right, surround left and right, and back left and right surround are remapped to the designated top left and right, middle left and right and bottom left and right channels in no particular pairing. The center channel may be divided into two separate speaker housings located left and right of the vertically-oriented display 106. The LFE (subwoofer) channel mapping is unchanged and delivered to a separate floor standing housing.

Top left and right channel speakers 202A and 202B may be located in the upper corner areas of the frame back 102. The center channel speakers 202G and 202H may be located between the x-axis and the upper corners of the frame back 102. The middle left and right channel speakers 202E and 202F may be located between the x-axis and the lower corners of the frame back 102. The bottom left and right channel speakers 202C and 202D may be located in the lower corner areas of the frame back 102. With the creation of the content soundtrack, the audio designer or engineer can designate certain sounds be emitted from one or more of the speakers 202A-H. For example, the sound of footsteps or other sounds occurring from objects at a low level (e.g. near the bottom of the vertically-oriented display 106) may be assigned to the bottom left and bottom right channel speakers 202C and 202D, the sound of an airplane flying overhead or other sounds occurring from objects at a high level (e.g. near the top of the vertically-oriented display 106) may be assigned to the top left and right channel speakers 202A and 202B with the sound panning from left to right or vice versa. The sound of a rocket liftoff, or other sounds occurring from objects moving from a lower portion to a higher portion of the vertically-oriented display 106, may be concentrated primarily in the bottom left and right channels 202C and 202D, and then pan vertically through the middle left and right channel speakers 202E and 202F, to the center channel speakers 202G and 202H, and then to the top left and right channel speakers 202A and 202B as the rocket lifts skywards. The LFEs 110 may deliver the deep rumbling sound of the rocket liftoff. Dialog may come primarily from the center channel speakers 202G and 202H with augmentation from the other speakers 202 in accordance with the position of the speaker on the display to give the effect in some examples of the dialog being emitted from the character's mouth.

For reasons of simplicity, speaker channels in FIG. 20 are illustrated with one speaker per housing. However, depending on the application multiple speakers 202, such as a tweeter and mid-range speaker, can be assembled within a single housing to achieve certain audio effects. The vertically-oriented display 106 screen can be standard aspect ratios such as, but not limited to, 4:3, 16:9, 1.85:1 or 2.35:1 or custom sizes as long as the long axis is mounted vertically to the user.

Figure 21:
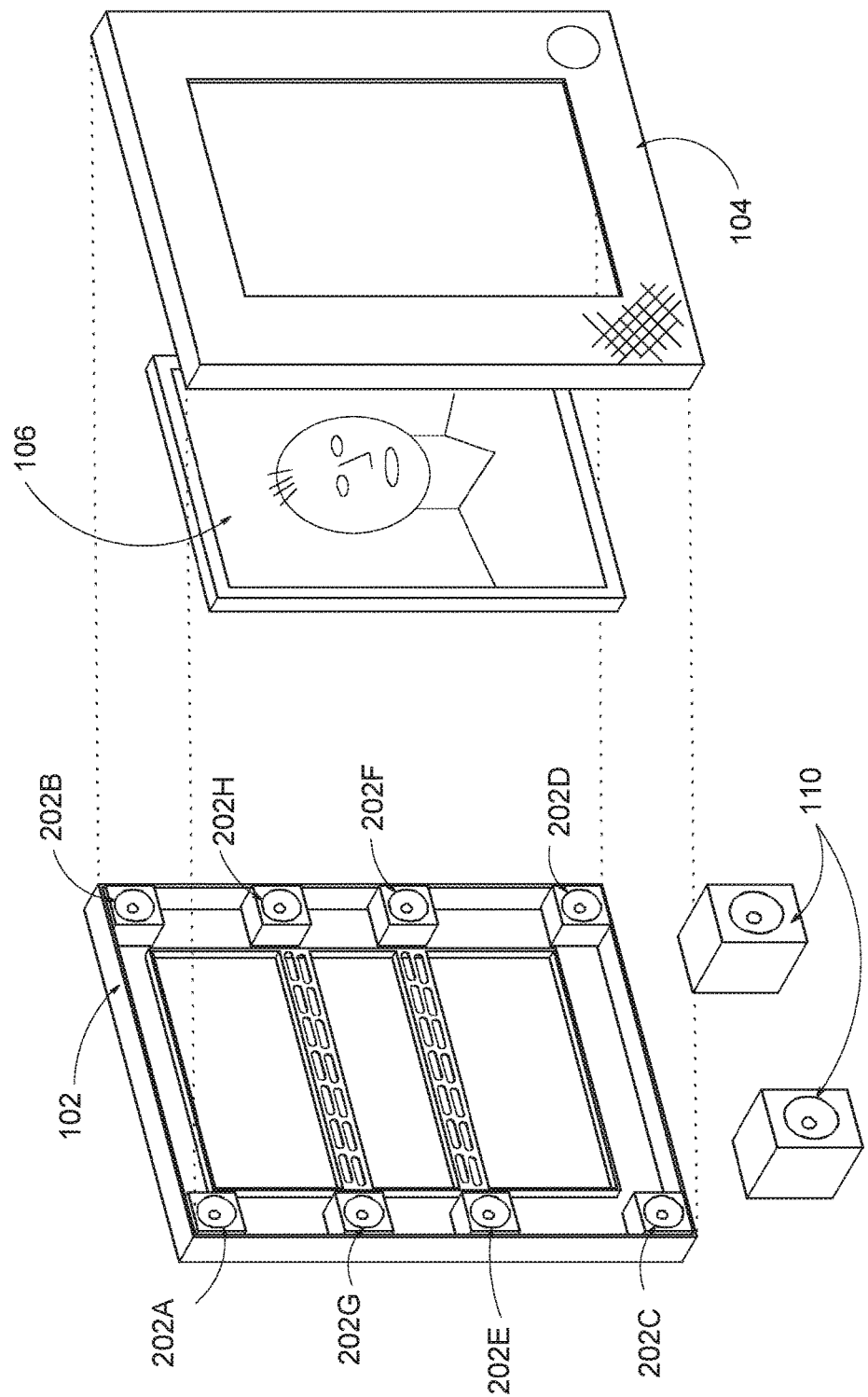
FIG. 21 illustrates 7.1 channel audio speaker locations in relation to a vertically-oriented display for an example audio frame.

FIG. 21 illustrates example 7.1 audio speaker locations in relation to a vertically-oriented display 106 for an example audio frame 100. The seven independent channel speakers 202A-H and LFEs 110 surround the audio frame 100 from left and right, and top to bottom.

Examples of 9.2 channel surround audio applications are also described herein.

Today we have a growing number of surround sound formats including 9.2, 11.2, and above. These more recent formats employ additional audio channels and related speakers 202. The following example illustrates how 9.2 audio may be remapped to example audio frame 100 devices and audio frame 100 Applications for integration into a vertically-oriented display 106 device with the caveat that similar remapping configurations would work as well for formats 11.2 and above.

Figure 22:
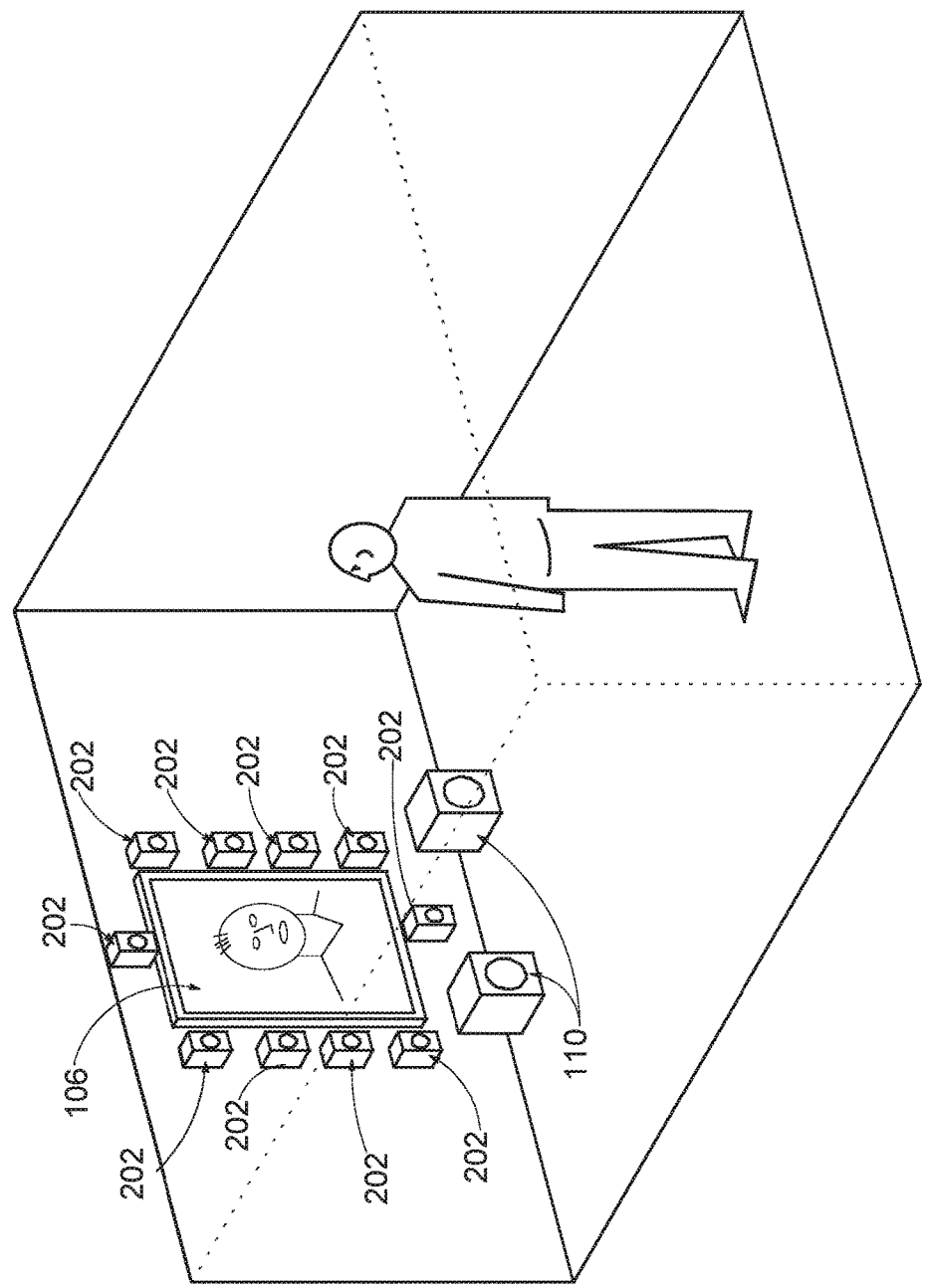
FIG. 22 illustrates locations for 9.2 channel audio speaker placement around a vertically-oriented display.

FIG. 22 illustrates example locations for 9.2 audio independent speaker placement around a vertically-oriented display 106. The nine independent channel speakers 202 and LFEs 110 surround the screen from left and right, and top and bottom to deliver audio that in some examples may more closely relate to the visual content.

Figure 23:
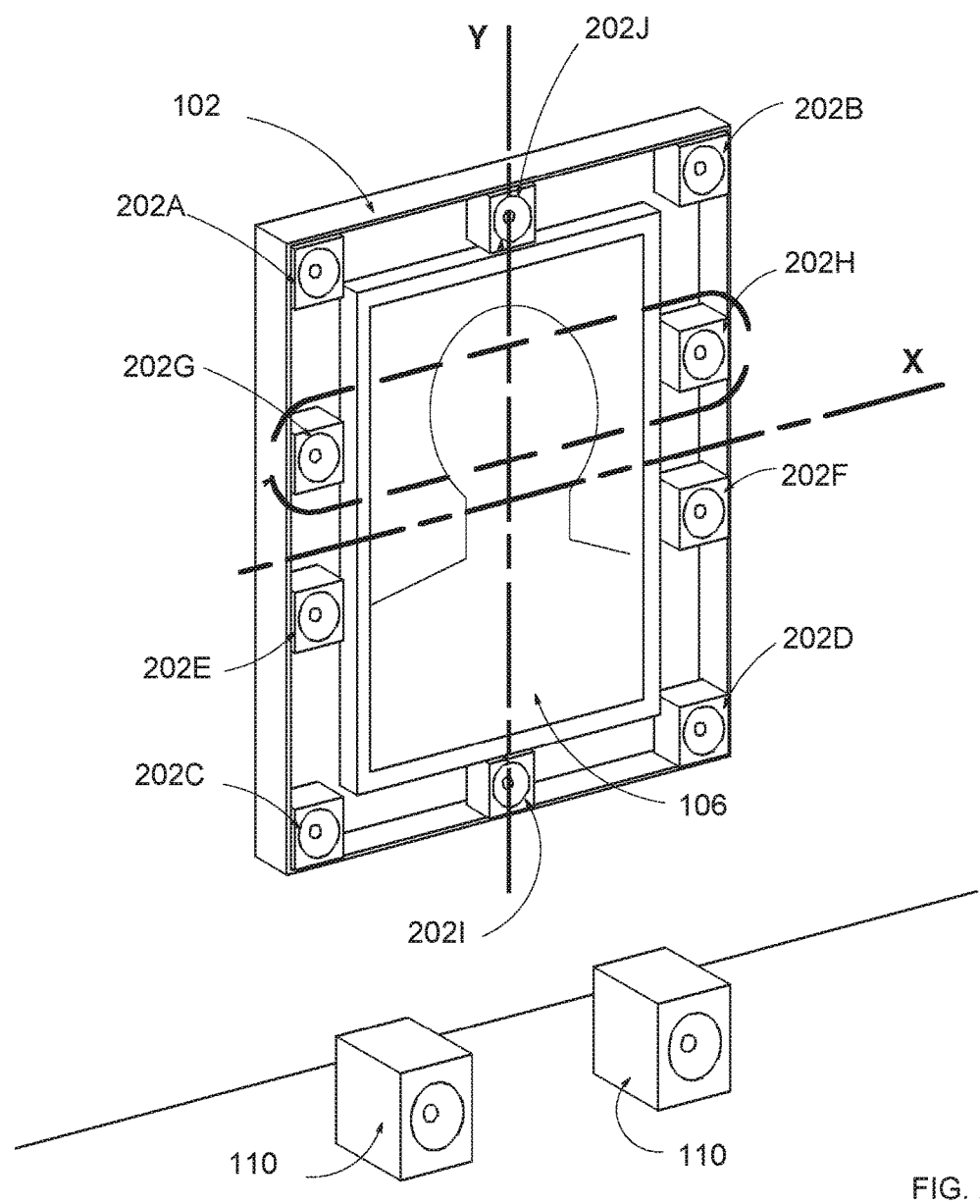
FIG. 23 illustrates locations for 9.2 channel audio speakers in an audio frame for a vertically-oriented display.

In the embodiment of FIG. 23, traditional 9.2 audio surround sound channels front left and right, surround left and right, back left and right surround, and front height left and right are remapped to the designated top left and right, middle left and right, bottom left and right, and bottom center/top center channels in no particular pairing. The center channel is divided into two separate speaker housings located left and right of the vertically-oriented display 106. The LFE (subwoofer) channel mapping is unchanged and delivered to two separate floor standing housings.

Top left and right channel speakers 202A and 202B may be located in the upper corner areas of the frame back 102. The center channel speakers 202G and 202H may be located between the x-axis and the upper corners of the frame back 102. The middle left and right channel speakers 202E and 202F may be located between the x-axis and the lower corners of the frame back 102. The bottom left and right channel speakers 202C and 202D may be located in the lower corner areas of the frame back 102. The top center and bottom center channel speakers 202I and 202J may be located above and below the vertically-oriented display 106 along the vertical y-axis. With the creation of the content soundtrack, the audio designer or engineer can designate certain sounds be emitted from one or more of the speakers 202A-J. For example, the sound of footsteps or other sounds occurring from objects at a low level (e.g. near the bottom of the vertically-oriented display 106) may be assigned to the bottom left and bottom right channel speakers 202C and 202D and/or the bottom center channel speaker 202I, the sound of an airplane flying overhead or other sounds occurring from objects at a high level (e.g. near the top of the vertically-oriented display 106) may be assigned to the top left and right channel speakers 202A and 202B and/or the top center channel speaker 202J with the sound panning from left to right or vice versa. The sound of a rocket liftoff, or other sounds occurring from objects moving from a low to a high level, may be concentrated primarily in the bottom left and right channel speakers 202C and 202D and/or the bottom center channel speaker 202I, and then pan vertically through the middle left and right channel speakers 202E and 202F, to the center channel speakers 202G and 202H, and then to the top left and right channel speakers 202A and 202B and/or the top middle channel speaker 202J as the rocket lifts skyward. The LFEs 110 may deliver the deep rumbling sound of the rocket liftoff. Dialogue may come primarily from the center channel speakers 202G and 202H with augmentation from the other 8 channels in accordance with a position of the speaker on the display to give the effect in some examples of the dialogue being emitted from the character's mouth.

For reasons of simplicity, the speakers in FIG. 23 are illustrated with one speaker per housing. However, depending on the application multiple speakers 202, such as a tweeter and mid-range speaker, can be assembled within a single housing to achieve certain audio effects. The vertically-oriented display 106 can be standard aspect ratios such as, but not limited to, 4:3, 16:9, 1.85:1 or 2.35:1 or custom sizes as long as the long axis is mounted vertically to an intended viewpoint of the user.

Figure 24:
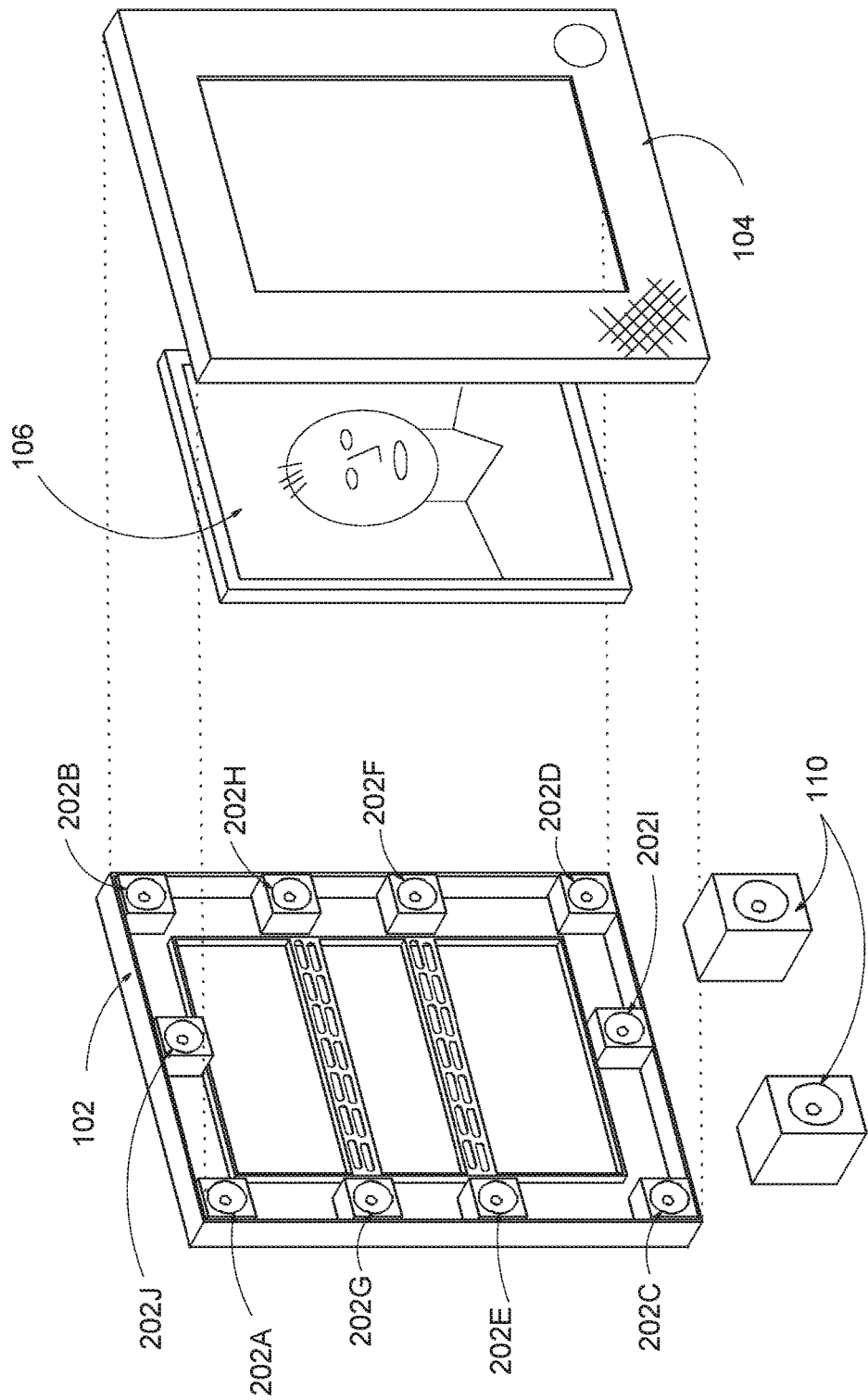
FIG. 24 illustrates 9.2 channel audio speaker locations in relation to a vertically-oriented display for an example audio frame.

FIG. 24 illustrates example 9.2 audio speaker locations in relation to a vertically-oriented display 106 for an example audio frame 100. The independent channel speakers 202 and LFEs 110 surround the audio frame 100 from left and right, and top to bottom.

Examples of accessories may also be provided in accordance with this disclosure.

New types of content may be created for the vertically-oriented display and television applications. In some types of content, audio accessories may be employed to augment the user's experience through sound effects and to create characters that may in some examples enhance the content yet live off the screen.

Figure 25:
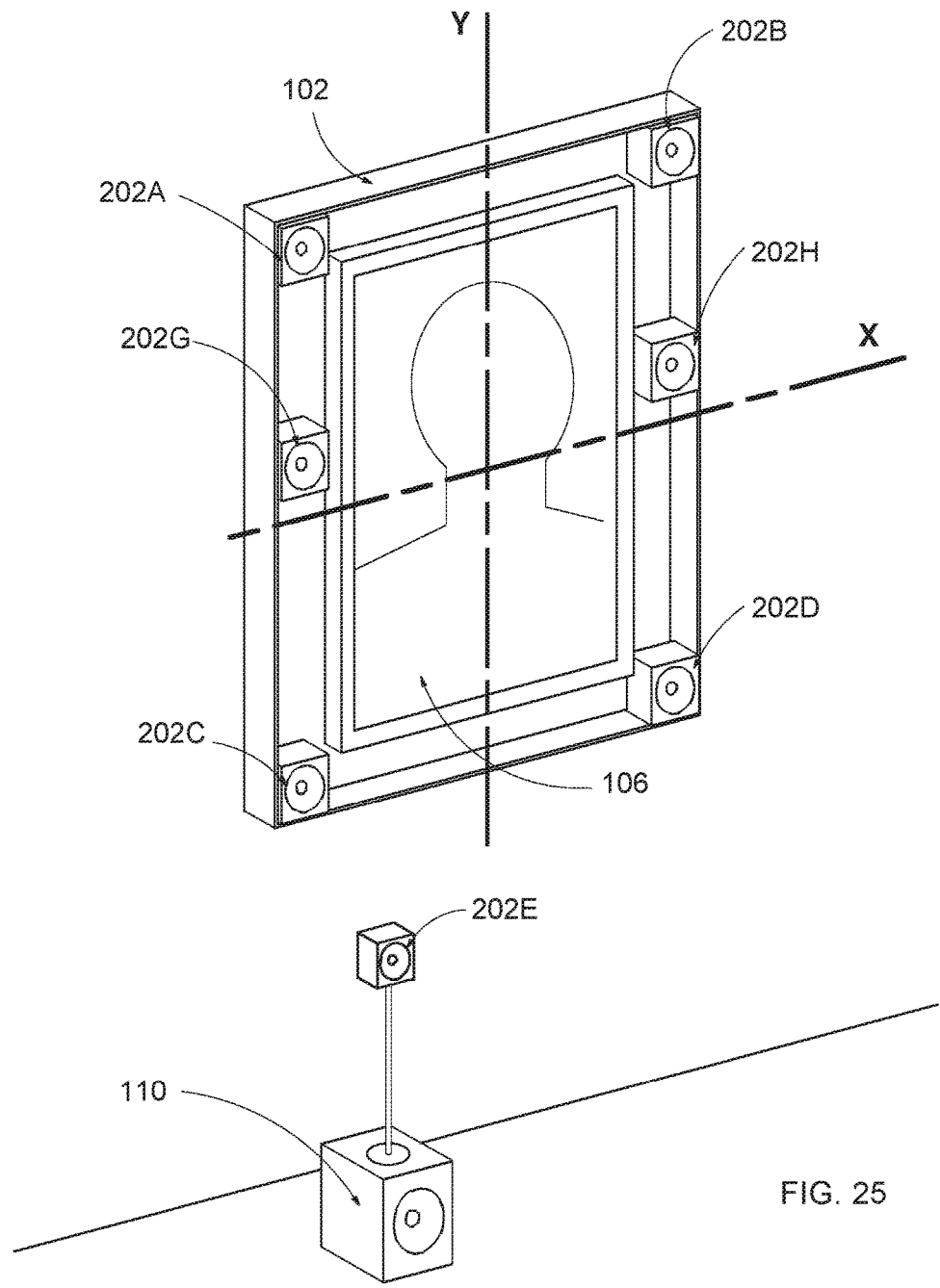
FIG. 25 illustrates audio speaker locations in relation to a vertically-oriented display with a center channel speaker mounted on a low frequency emitter.

In the embodiment of FIG. 25, 7.1 audio surround sound channel speakers front left and right, surround left and right, and back left and right surround are remapped to the designated top left and right channel speakers 202A and 202B, middle channel speakers 202G and 202H, and bottom left and right channel speakers 202C and 202D. The middle left and right channel speakers 202G and 202H may be used primarily for dialog with augmentation from the channels above and below in some examples. The center channel speaker 202E may be remapped to an audio accessory including a speaker connected to the LFE 110. The LFE 110 channel mapping is unchanged.

With the creation of the content soundtrack, the audio designer or engineer can designate certain sounds be emitted from one or more of the speaker channels as explained in previous examples. For embodiment of FIG. 25, the content creator can employ the center channel speaker 202E to augment the content through sound effects or the addition of an off-screen voice or character.

This example is based on the 7.1 audio format but other formats such as 3.1, 5.1, 6.1, 9.2, and above could also have one or more of the channels remapped to one or more audio accessories.

For reasons of simplicity, speaker channels in FIG. 25 are illustrated with one speaker per housing. However, depending on the application multiple speakers 202, such as a tweeter and mid-range speaker, can be assembled within a single housing to achieve certain audio effects.

Figure 26C:
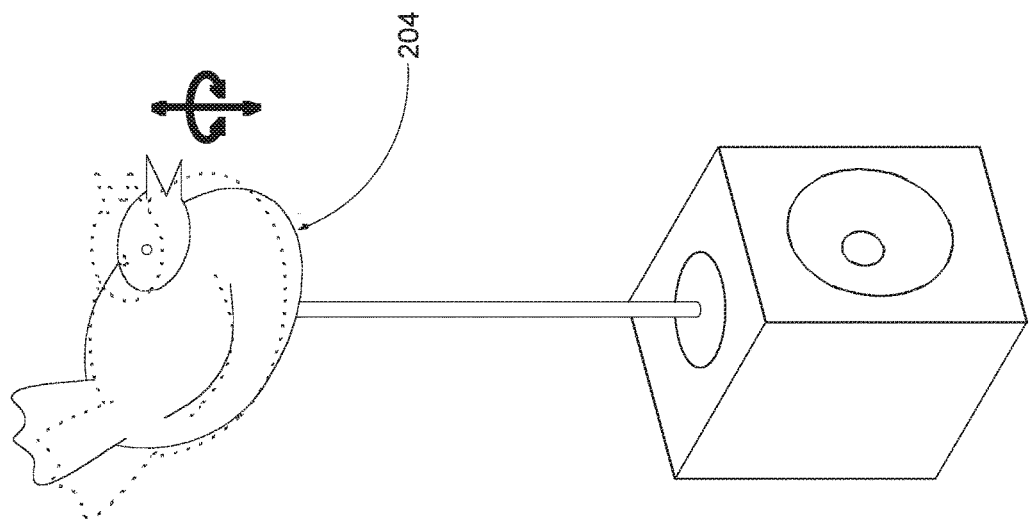
FIGS. 26A-C illustrate an example add-on audio accessory connected to a low frequency emitter.
Figure 26B:
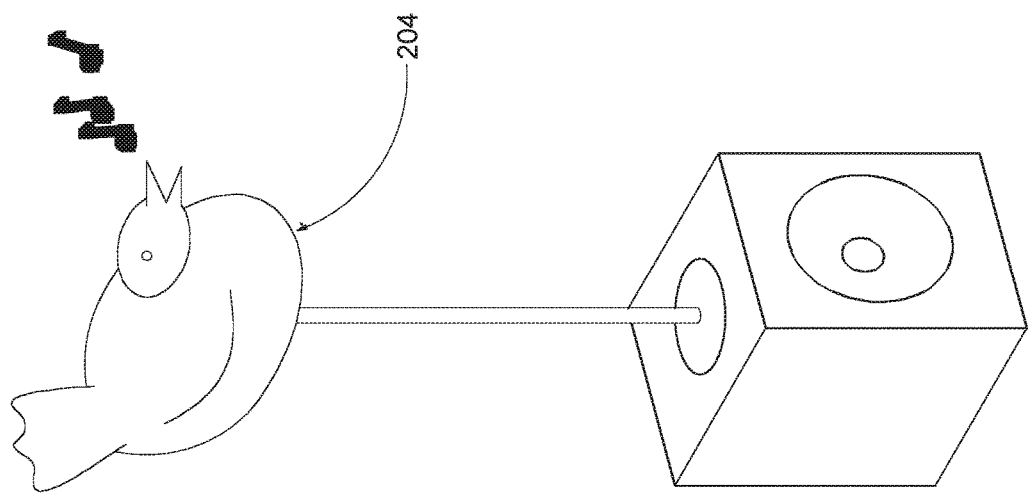
Figure 26A:
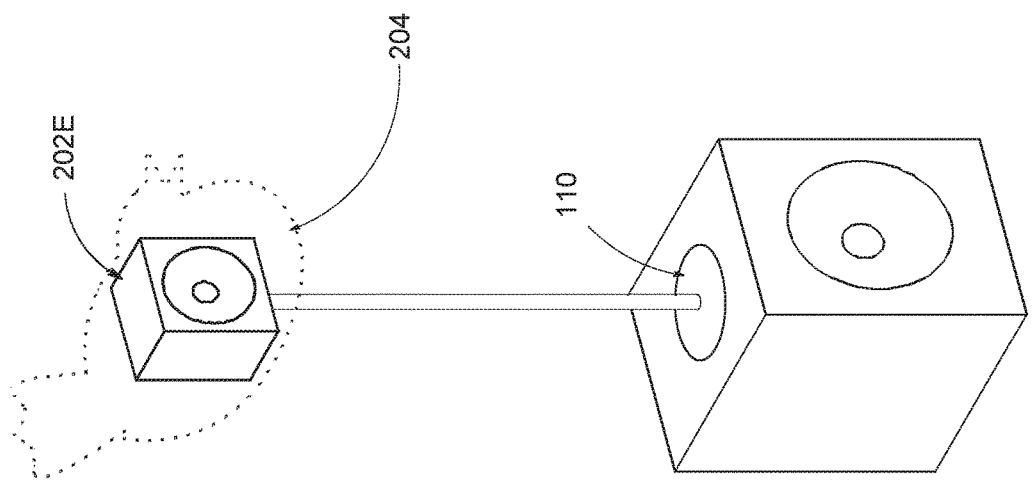

FIGS. 26A-C illustrate an example add-on audio accessory 204 connected to the LFE 110 and/or the center channel speaker 202E of FIG. 25. The LFE 110 includes a dock that receives the audio accessory 204.

FIG. 26A illustrates an audio accessory 204 (e.g. an additional speaker 202E) connected to a dock via a long tube to raise the speaker closer to ear level. This additional speaker 202E may receive audio content by either being wired to connectors in the dock or wirelessly (e.g. Wi-Fi or Bluetooth).

FIG. 26B illustrates how the housing of the audio accessory 204 may take on various shapes and sizes, in this case the shape of a bird, but other shapes may also be used (e.g. a different animal or character, a magic star, a sound emitting flower etc.). The content creator may utilize the additional speaker 202E (e.g. bird) as part of the user experience. For example, the bird could be chirping a song as the main screen was showing a beautiful sunrise, or the bird may be the narrator for a story, or tell a joke, or get upset when there is a movie of a cat on the main screen.

FIG. 26C illustrates that example audio accessories 204 may also have movement. Small motors mounted inside the audio accessory 204 may be driven either wirelessly or by non-audible audio tones. With the latter, motion for the audio accessory 204 may be scripted directly into the content soundtrack. For the bird example, movements could include the beak moving to match the sound being emitted, bobbing up and down and rotating left to right.

Figure 27C:
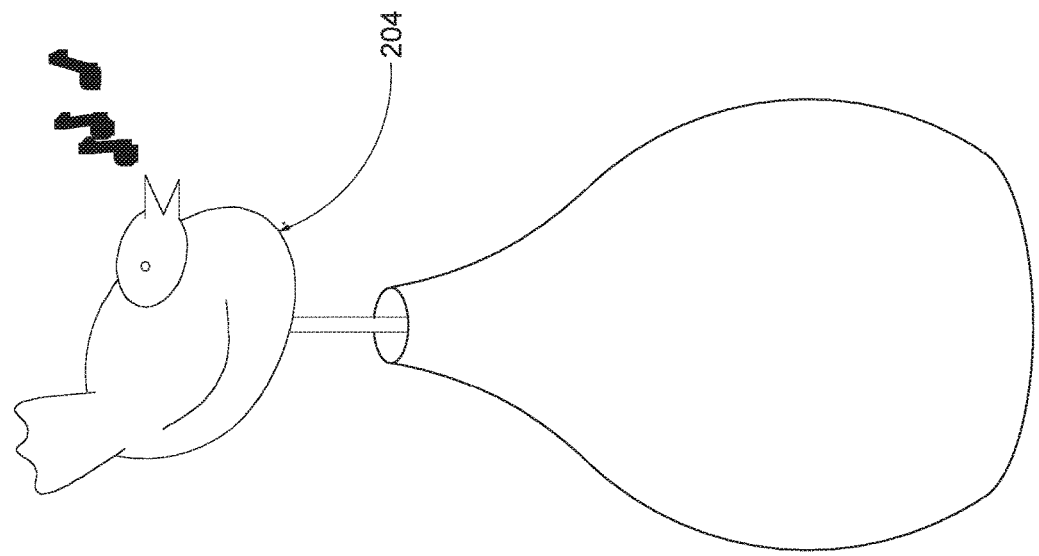
FIGS. 27A-C illustrate example housings for a low frequency emitter.
Figure 27B:
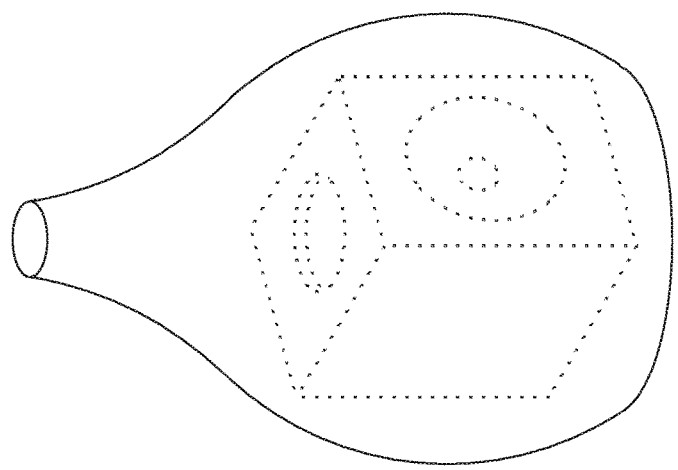
Figure 27A:
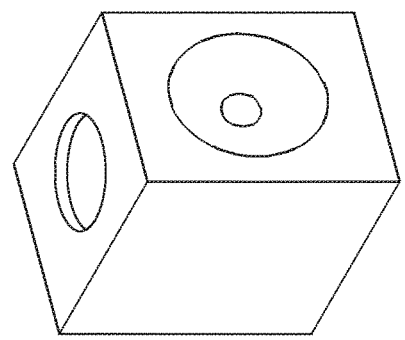

FIGS. 27A-C illustrate that example housings for the LFE 110 may take on various forms and shapes other than a box. FIG. 27A illustrates a typical rectangular box speaker housing. FIG. 27B illustrates that speaker housings can take on many other form factors that better integrate into the home environment. In this case, the speaker housing is shaped to emulate a vase. In other examples, other shapes may be used, including but not limited to, a potted plant or large throw pillow to mention a few. FIG. 27C illustrates that an audio accessory 204 such as the one described above with respect to FIGS. 26A-C may be docked into a unique speaker housing.

Figure 28:
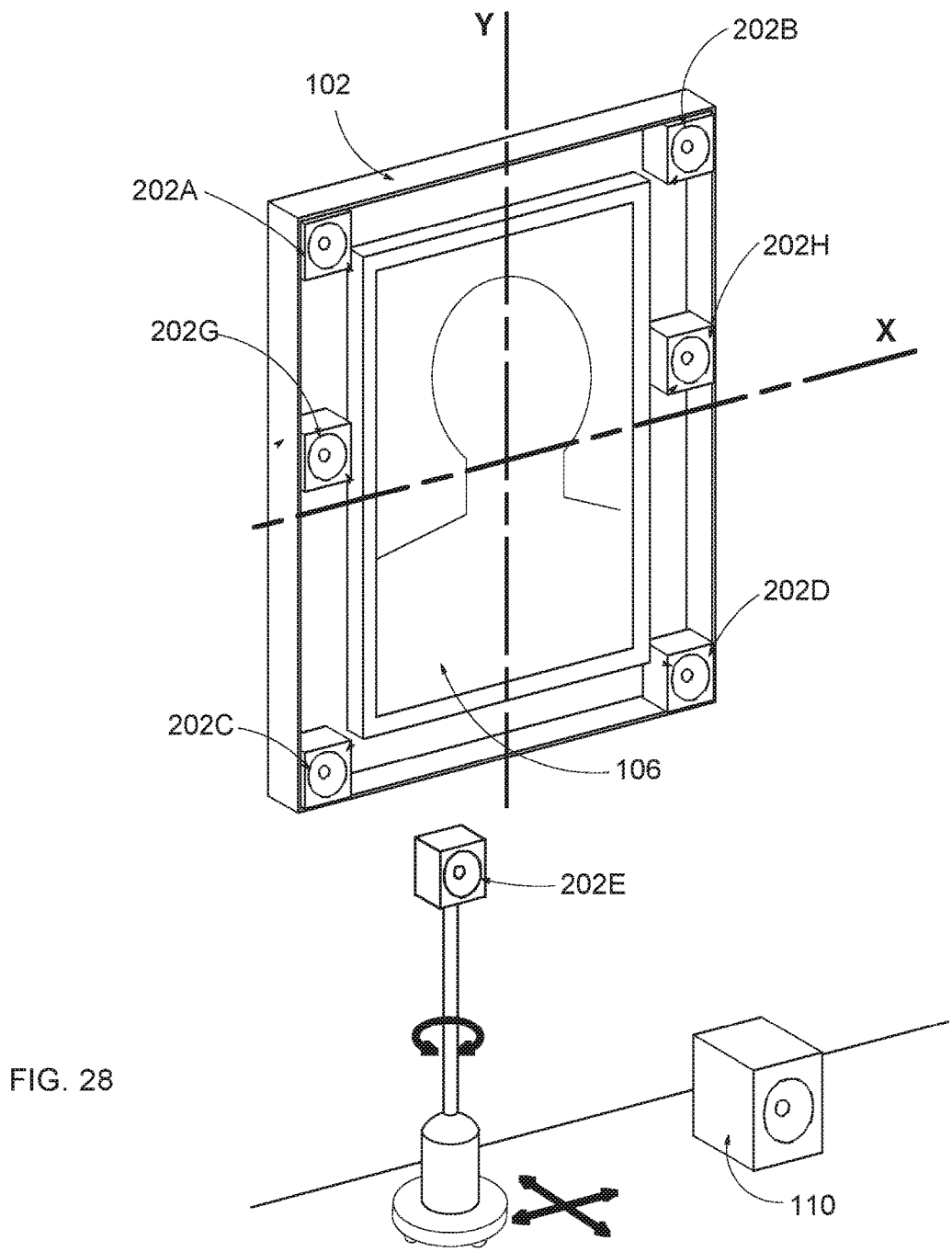
FIG. 28 illustrates a center channel remapped to a robotic audio accessory.

FIG. 28 illustrates a center channel remapped to a robotic audio accessory having an automated, movable base. In the embodiment of FIG. 28, 7.1 audio surround sound channels front left and right, surround left and right, and back left and right surround are remapped to the designated top left and right channel speakers 202A and 202B, middle left and right channel speakers 202G and 202H, and bottom left and right channel speakers 202C and 202D. The middle left and right channel speakers 202G and 202H may be used in some examples primarily for dialog with augmentation from the channels above and below. The center channel is remapped to a robotic audio accessory which may be implemented using a wireless center channel speaker 202E capable of movement along the floor. The LFE 110 channel mapping is unchanged.

With the creation of the content soundtrack, the audio designer or engineer can designate certain sounds be emitted from one or more of the speakers 202 as explained in previous examples. For this audio accessory example, the content creator may employ the center channel speaker 202E to augment the content through sound effects or the addition of an off-screen voice or character.

This example is based on the 7.1 audio format but other formats such as 3.1, 5.1, 6.1, 9.2, and above could also have one or more of the channels remapped to one or more audio accessories.

For reasons of simplicity, speakers in FIG. 28 are illustrated with one speaker per housing. However, depending on the application multiple speakers 202, such as a tweeter and mid-range speaker, can be assembled within a single housing to achieve certain audio effects.

Figure 29C:
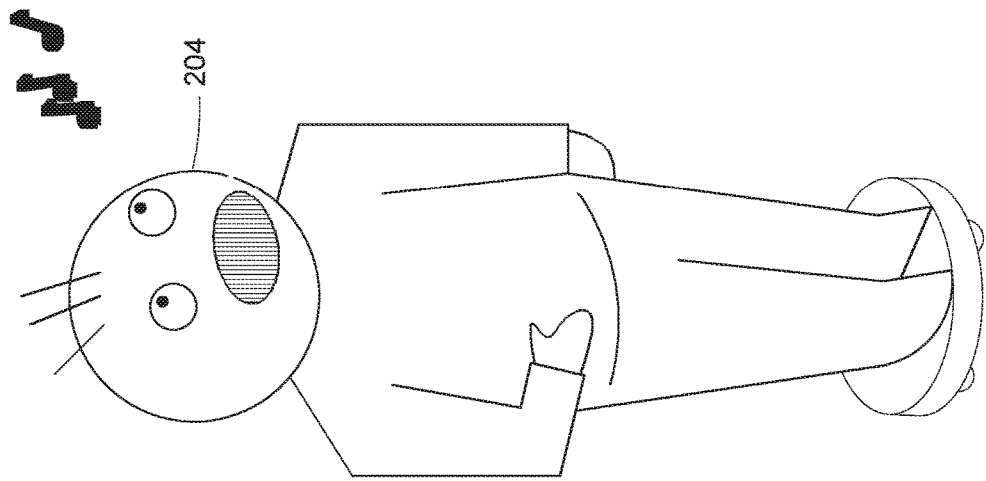
FIGS. 29A-C illustrate example robotic audio accessories.
Figure 29B:
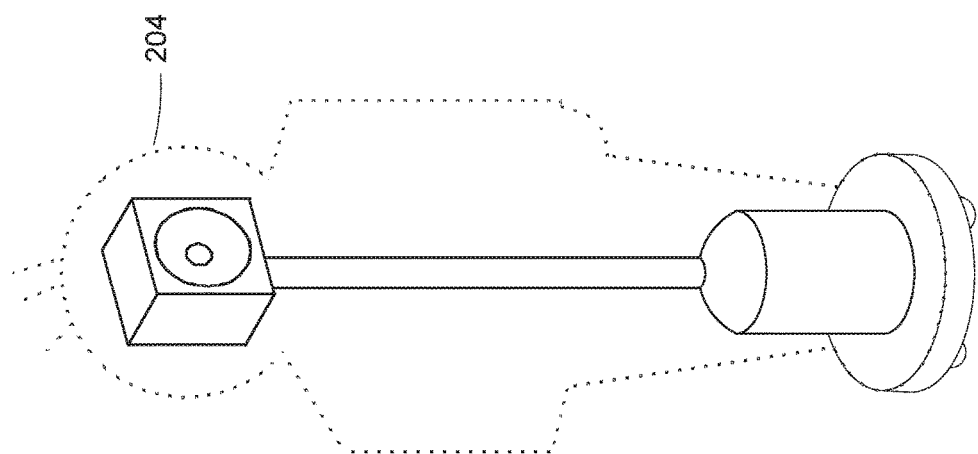
Figure 29A:
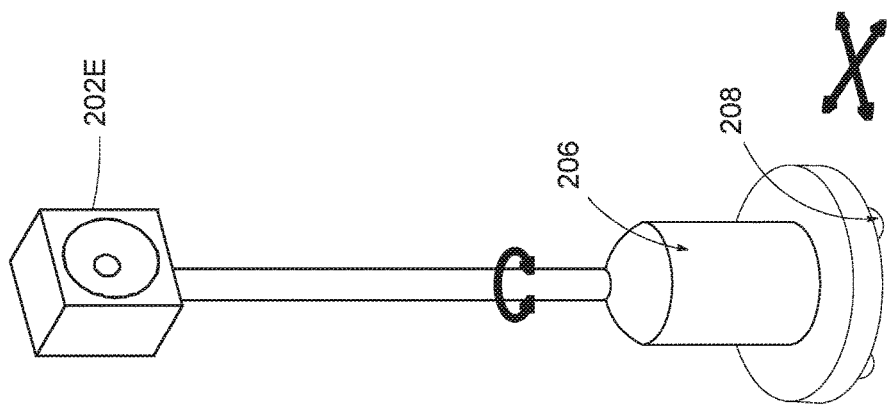

FIGS. 29A-C illustrate an example robotic audio accessory.

FIG. 29A illustrates an example Robotic audio accessory (e.g. additional speaker 202E), which is connected to a motorized base 206 via a long tube to raise the speaker closer to ear level. The motorized base may receive commands wirelessly or by non-audible audio tones and may be capable of moving in straight or circular motions along the floor on wheels 208. With non-audible audio tones, motion for the audio accessory may be scripted directly into the content soundtrack.

FIG. 29B illustrates how the robotic audio accessory housing 204 can take on various shapes and sizes, in this case the shape of a small human like figure, ghost or alien, but other shapes may also be used (e.g. an animal, a magic star, a sound emitting flower etc.).

FIG. 29C is an example of how the content creator can utilize the robotic audio accessory (e.g. additional speaker) as part of the user experience. For example, the small human like figure could be whistling a tune as the main screen was showing a beautiful sunrise, or the figure is the narrator for a story, or tells a joke, or gets upset when there is a movie of a ferocious bear on the main screen.

From the foregoing it will be appreciated that, although specific embodiments of the invention have been described herein for purposes of illustration, various modifications may be made without deviating from the spirit and scope of the invention.

What is claimed is:

1. An audio system for a display having a vertically-oriented aspect ratio comprising:
    a frame back;
    a front housing configured to mate with the frame back;
    a plurality of speakers mounted between the frame back and the front housing around a perimeter of the display and configured to provide audio that is spatially coordinated with images displayed on the display; and
    a center channel speaker mounted on an automated moveable base, wherein the center channel speaker is configured to emit sound associated with images displayed on the display and to move autonomously in response to images or video displayed on the display.

2. The audio system of claim 1, wherein the plurality of speakers comprises a top speaker configured to provide audio that is vertically spatially coordinated with images displayed at a top of the display.

3. The audio system of claim 2, wherein the plurality of speakers further comprises a bottom speaker configured to provide audio that is spatially coordinated with images displayed at a bottom of the display.

4. The audio system of claim 3, wherein the plurality of speakers further comprises a pair of center channel speakers positioned on either side of the display.

5. The audio system of claim 3, wherein the bottom speaker and the top speaker are aligned along a vertical axis of the display.

6. The audio system of claim 3, wherein the bottom speaker is located at a lower corner of the display and the top speaker is located at an upper corner of the display.

7. The audio system of claim 3, further comprising a subwoofer located external to the frame back and the front housing.

8. The audio system of claim 7, further comprising a second center channel speaker mounted on the subwoofer.

9. The audio system of claim 1, wherein the second center channel speaker is further configured to provide audio that is spatially coordinated with images or video displayed on the display and a location of the second center channel speaker.

10. A method of providing audio for a display having a vertically-oriented aspect ratio comprising, while the display is installed in a vertical stand or on a wall:
 emitting sounds from a first pair of speakers positioned at a lower end of the display, wherein the sounds emitted from the first pair of speakers are associated an object in a video displayed on the display, wherein the object is displayed at the lower end of the display; and
 in response to vertical movement of the object within the video from the lower end of the display to an upper end of the display:
  emitting sounds associated with the object in the video from a second pair of speakers positioned at the upper end of the display; and
  stopping emission of the sounds associated with the object in the video from the first pair of speakers; and
 autonomously moving a center channel speaker mounted on an automated moveable base in response to the video displayed on the display, wherein the center channel speaker is configured to emit sound associated with the video displayed on the display.

11. The method of claim 10, further comprising emitting sounds from a third pair of speakers positioned on either side of the display between the upper end and the lower end of the display, wherein the sounds emitted from the third pair of speakers are associated the video displayed on the display.

12. The method of claim 11, wherein further in response to the vertical movement of the object within the video from the lower end of the display to an upper end of the display, prior to emitting sounds associated with the object in the video from the second pair of speakers and after stopping emission of the sounds associated with the object in the video from the first pair of speakers:
 emitting sounds associated with the object in the video from the third pair of speakers positioned between the upper end and the lower end of the display; and
 stopping emission of the sounds associated with the object in the video from the third pair of speakers as the object transitions out of an area between the upper end and the lower end of the display.

\* \* \* \* \*